US006933712B2

(12) United States Patent
Miller et al.

(10) Patent No.: US 6,933,712 B2
(45) Date of Patent: Aug. 23, 2005

(54) ELECTRICAL CIRCUIT TRACING AND IDENTIFYING APPARATUS AND METHOD

(75) Inventors: Larry Miller, Los Gatos, CA (US); Paul Drew Ehrensberger, Jr., Sunnyvale, CA (US)

(73) Assignee: Zircon Corporation, Campbell, CA (US)

( * ) Notice: Subject to any disclaimer, the term of this patent is extended or adjusted under 35 U.S.C. 154(b) by 0 days.

(21) Appl. No.: 10/197,617

(22) Filed: Jul. 15, 2002

(65) Prior Publication Data

US 2004/0008018 A1 Jan. 15, 2004

(51) Int. Cl.⁷ .............................................. G01R 19/08
(52) U.S. Cl. ........................................................ 324/67
(58) Field of Search .............................. 324/66, 67, 326, 324/527–533; 379/25

(56) References Cited

U.S. PATENT DOCUMENTS

| | | | |
|---|---|---|---|
| 3,836,855 A | | 9/1974 | Zaleski |
| 4,491,785 A | | 1/1985 | Pecukonis .................... 324/67 |
| 4,556,839 A | | 12/1985 | George ......................... 324/66 |
| 4,642,556 A | | 2/1987 | Pecukonis .................... 324/67 |
| 4,652,861 A | * | 3/1987 | Domes ...................... 340/539.1 |
| 4,801,868 A | | 1/1989 | Brooks ........................ 324/66 |
| 4,906,938 A | | 3/1990 | Konopka ..................... 324/529 |
| 5,418,447 A | | 5/1995 | Beha et al. .................... 324/67 |
| 5,422,564 A | | 6/1995 | Earle et al. ................... 324/67 |
| 5,467,011 A | * | 11/1995 | Hunt ............................. 324/67 |
| 5,497,094 A | | 3/1996 | George ........................ 324/529 |
| 5,969,516 A | | 10/1999 | Wottrich ....................... 324/67 |
| 6,163,144 A | | 12/2000 | Steber et al. .................. 324/67 |
| 6,392,395 B2 | | 5/2002 | Roberts et al. ............... 324/66 |
| 6,411,073 B1 | * | 6/2002 | Fischer et al. ............... 324/66 |

FOREIGN PATENT DOCUMENTS

| | | |
|---|---|---|
| FR | 2 578 328 | 9/1986 |
| WO | WO 93/12488 | 6/1993 |
| WO | WO 2004/008159 | 1/2004 |

OTHER PUBLICATIONS

International Search Report mailed Aug. 5, 2004, for PCT patent Application No. PCT/US03/21532, filed Jul. 9, 2003, 8 pages.
PCT patent Application No. PCT/US03/21532 filed on Sep. 7, 2003, 5 pages.

* cited by examiner

*Primary Examiner*—Edward Lefkowitz
*Assistant Examiner*—Reena Aurora
(74) *Attorney, Agent, or Firm*—Morrison & Foerster LLP

(57) ABSTRACT

A transmitter that is electrically connected to a circuit and an associated receiver is used to identify an element of that circuit in the presence of other circuits. This may be used in AC or DC systems that are powered or not to identify or trace circuit elements such as lines, junctions, switches, fuses, or breakers. One version that identifies the circuit breaker of the circuit connected to the transmitter in a powered AC distribution system.

30 Claims, 19 Drawing Sheets

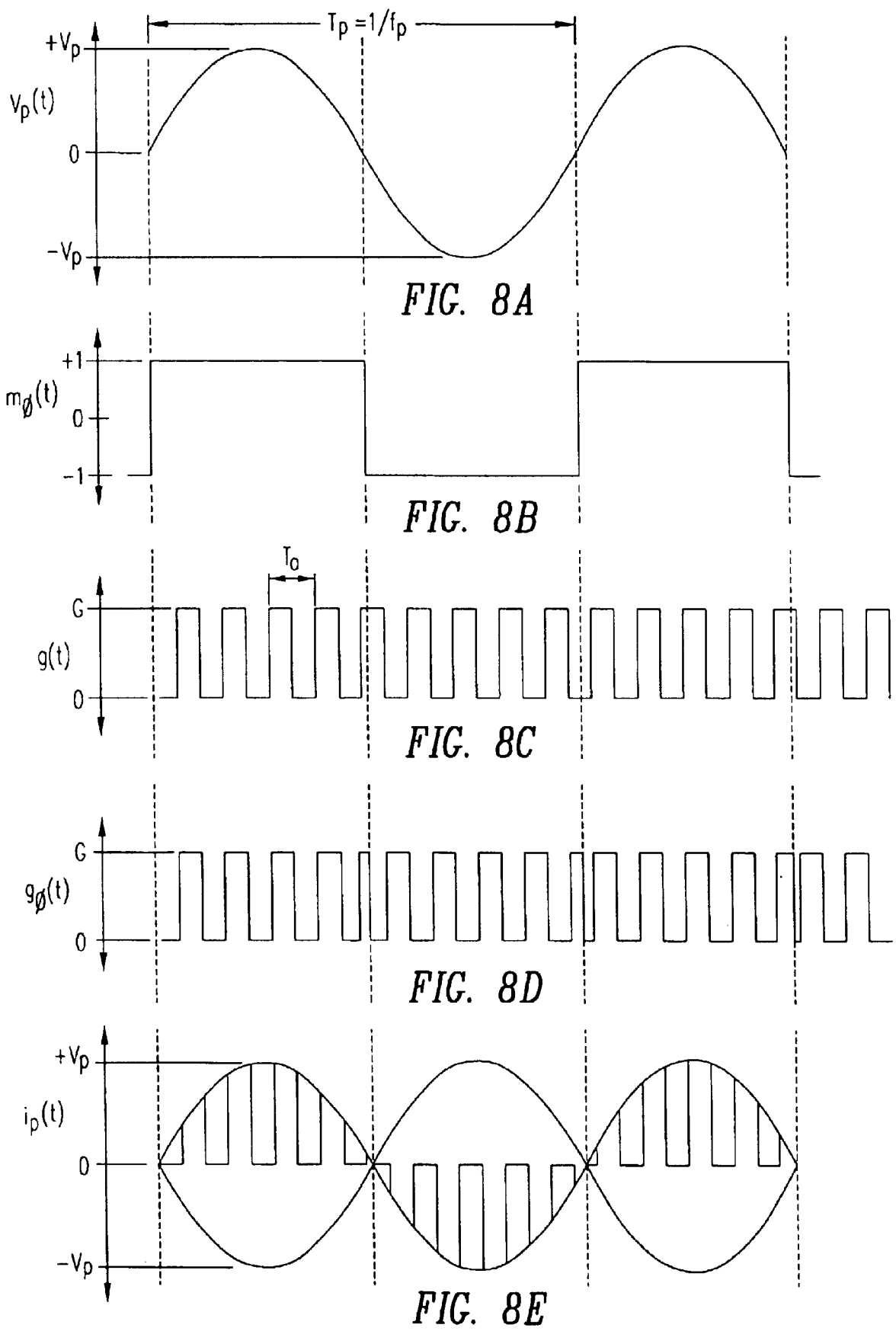

ELECTRICAL CIRCUIT TRACING AND IDENTIFYING APPARATUS AND METHOD

BACKGROUND OF THE INVENTION

1. Field of the Invention

The present invention relates to electrical-test equipment used for tracing conductors and identifying electrical circuit elements.

2. Discussion of Related Art

Electrical work often requires identifying elements of a circuit or tracing a circuit behind a wall or other obstruction. For example, an electrician may wish to determine which circuit breaker is attached to a particular wall outlet so that repairs may be made. By identifying the proper circuit, the electrician can de-energize just a single circuit before performing the repairs. Typically, the electrician prefers not to shut down equipment attached to other circuits. Alternatively, the electrician may wish to trace a hidden wire along a wall to locate a convenient place to add another outlet.

Some devices for locating and identifying electrical circuits use a transmitter and a receiver. A transmitter 10 induces a current signal on the circuit in question. A receiver 100 senses the induced signal.

FIG. 1 illustrates how a transmitter and receiver are used with a power distribution system. A transmitter 10 is physically connected to a circuit 11 in question. The transmitter 10 may be connected to the circuit 11 by, for example, plugging the device into an outlet (as shown) or using jumper wires. The transmitter 10 induces an electrical current signal in the circuit 11 in question. The circuit 11 radiates electromagnetic radiation 20 along its path. The receiver 100 receives the electromagnetic radiation 20 emanating from the circuit 11 in question.

The receiver 100 may be used to identify a circuit breaker fuse 13 connected to circuit 11 or may be used to trace hidden wires of circuit 11. To identify a circuit breaker, the electrician scans the receiver 100 over a circuit breaker panel 12 containing multiple circuit breaker fuses 13 and 14. Circuit breaker fuse 13 is directly connected to circuit 11 while circuit breaker fuses 14 are connected to other circuits 15. As the receiver 100 passes over circuit breaker fuse 13, the receiver 100 alerts the electrician. To trace a hidden wire, the electrician passes the receiver 100 over the area suspected of concealing the circuit 11. The receiver 100 provides the electrician with a signal strength indication of received electromagnetic radiation 20.

Some devices for identifying and tracing electrical systems use low-frequency, short duration signals. They use the line frequency of 50 Hz or 60 Hz. The transmitter sends a short duration pulse that lasts for approximately 10 microseconds. Due to the nature of the transmitted pulse, the frequency spectrum is very wide and an associated receiver is required to sense a wide-bandwidth radiated signal. For examples of low-frequency, short duration pulse transmitters and wide-bandwidth receivers, see U.S. Pat. Nos. 4,556,839, 4,906,938, 5,497,094, and 5,969,516, herein incorporated by reference.

Other devices for identifying and tracing electrical systems modulate a signal on a high-frequency carrier. Their carrier frequencies range from approximately 3950 Hz to approximately 200 kHz. A high-frequency carrier has the advantage that the transmitter signal easily couples to the receiver. For examples of transmitters and receivers sending and sensing carrier signals modulated on a high-frequency, see U.S. Pat. Nos. 4,491,785, 4,642,556, 4,801,868, 5,418, 447, 5,422,564, and 6,163,144, herein incorporated by reference.

Known devices either: (1) use a manual calibration system that requires the electrician to adjust the sensitivity of the receiver; or (2) require the electrician to remember the strongest signal sensed as a scan is performed.

As described below, these known devices give false-positive indications for several reasons. For example, (1) the signal from the transmitter couples to adjacent circuits; (2) a load on another circuit masquerades as the transmitted signal; and (3) the electrician fails to properly calibrate the device.

A receiver 100 can give a false-positive indication when a signal 20 from a transmitter 10 couples to adjacent or neighboring circuits 15. Electromagnetic radiation 20 radiates from the target circuit 11 carrying the transmitted signal to neighboring circuits 15 thus inducing current on the neighboring circuits. Coupling from the target circuit 11 to neighboring circuits draws energy away from the target circuit 11. The magnitude of the signal coupled to a neighboring circuit 15 relates to the transmitted signal's carrier frequency. The higher the carrier frequency, the more easily the signal couples to other circuits. A change to the carrier frequency causes a proportional change to the magnitude of the coupled signal. The non-target neighboring circuits 15 re-radiate the coupled modulated signal and thus may lead to false-positive indications.

A receiver 100 can give a false-positive indication when a load on another circuit 15 masquerades as the transmitted signal. Loads on other circuits 15 might generate noise that may be miss-interpreted as a signal from the transmitter 10. For example, power modulating devices, such as switching power supplies, light dimmers, and motor controllers, generate noise that a receiver 100 might erroneously identify as a signal from the transmitter 10. Some power modulating devices reference the power line voltage and frequency when generating power. Consequently, these devices may create extraneous current noise at multiples or harmonics of the power line frequency. A receiver 100 might not be immune to this current noise from active loads and may erroneously determine that this noise is a signal sent by the transmitter 10.

To address the noise immunity problem described above, some transmitters use a modulation scheme that the receiver automatically recognizes. Some devices modulate a low-frequency signal on a high-frequency carrier. These devices rely on the electrician to perceive the difference between a transmitter's signal and noise generated by loads. These devices offer visual and audio indicators that pulse at the low-frequency signal rate. See, for example, U.S. Pat. Nos. 4,642,556, 5,418,447, 5,422,564 and 6,163,144, herein incorporated by reference. High-frequency carriers used by these systems more often exhibit detectable intercircuit coupling. By the selection of a high-frequency carrier, these systems inherently fail to address the problem of a transmitted signal on a target circuit 11 coupling to adjacent circuits 15.

A receiver can also give a false-positive indication when the electrician fails to properly calibrate the device. To calibrate some devices, the electrician manually adjusts the gain of the received signal using a sensitivity adjustment. By reducing the sensitivity, fewer signals are detected. The electrician take readings from each of the candidate elements while continually adjusting the calibration control until only one indication is obtained. Similar devices take a different approach that includes a thermometer-type visual display and variable-volume audio indicator. The electrician is instructed to remember the largest signal observed and to take this signal as the identified target circuit. See, for example, U.S. Pat. No. 6,163,144, herein incorporated by reference. These system rely on human experience and skill to properly detect circuits.

Thus, there is a desire and need for a device and method capable of tracing conductors and identifying electrical circuit elements with a reduced false-positive error rate.

SUMMARY

Embodiments of the present invention provide an improved electrical circuit tracing and identifying apparatus and method. Specifically, according to some embodiments of the present invention, a method and apparatus provide fewer false-positive indications than do presently known devices.

To reduce false-positive indications, some embodiments of the present invention transmit and receive a mid-range carrier frequency between 120 Hz and 3900 Hz. Using a mid-range carrier frequency reduces coupling to adjacent circuits.

To reduce false-positive indications, some embodiments of the present invention locate a carrier frequency between a pair of adjacent harmonics of the power line frequency. Locating a carrier frequency between harmonics of the power line frequency mitigates the confusion receivers have in distinguishing between a transmitted signal and signals generated by other loads.

To reduce false-positive indications, some embodiments of the present invention use a time-variant filter. The time-variant filter integrates over an integral number of power line cycles to eliminate responses at harmonics of the power of the frequency and to reduce confusion between the transmitted signal and signals generated by other loads.

To reduce false-positive indications and to reduce errors due to erroneous calibration by the electrician, some embodiments of the present invention automatically compare the levels of received signals. By comparing received signal levels, a device automatically calibrates itself.

To reduce false-positive indications, some embodiments of the present invention implement a phase switching process. Phase switching helps to concentrate the spectral components of the transmitted signal about the carrier frequency.

The present invention is better understood upon consideration of the detailed description below and the accompanying drawings.

BRIEF DESCRIPTION OF THE DRAWINGS

FIGS. 8A through 8E show phased-switched waveforms in accordance with the transmitter of FIG. 2.

In the present disclosure, like objects that appear in more than one figure are provided with like reference numerals.

DETAILED DESCRIPTION

Figure 1:
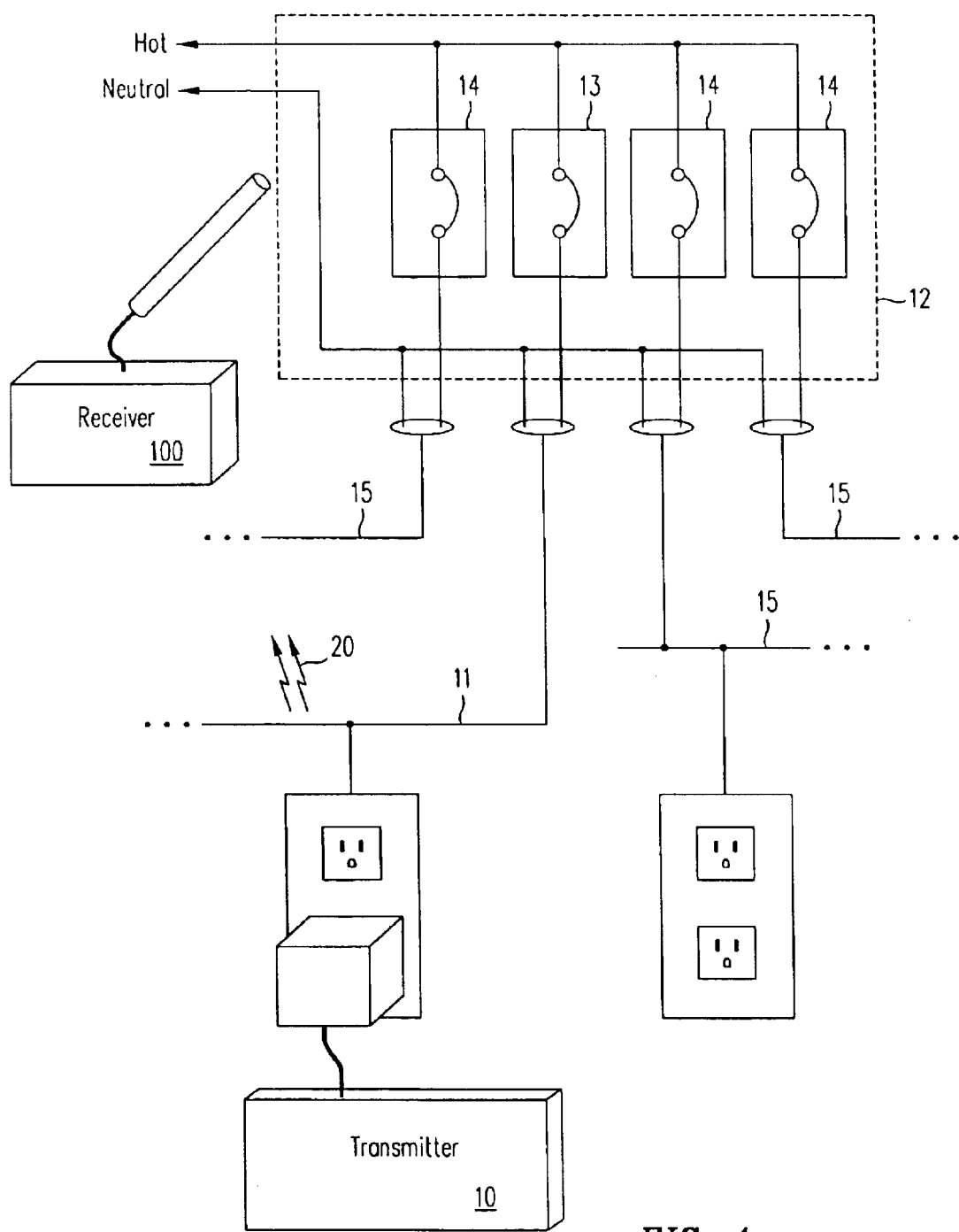
FIG. 1 illustrates how a transmitter and receiver are used with a power distribution system.

FIG. 1 illustrates how a transmitter 10 and a receiver 100 are used with a power distribution system. In some embodiments of the present invention, a transmitter 10 directly connects to a power distribution system through a wall outlet. In some embodiments, the transmitter 10 directly connects to the distribution wiring by, for example, jumper wires. The transmitter 10 then energizes a circuit 11 of the power distribution system. A receiver 100 detects electromagnetic radiation 20 induced by the transmitter 10. The receiver 100 senses the electromagnetic radiation 20 emanating from the energized wires of the circuit.

With proper modifications, some embodiments of the present invention may be used to identify circuit elements or to trace circuits on powered or un-powered lines. Powered lines may carry either alternating current (AC) or direct current (DC) at a low or high voltage.

For un-powered lines, power is disconnected from the circuit breaker box 12. The hot and neutral conductors are temporarily connected together to create a closed circuit within the local distribution system. For the un-powered cases, the transmitter 10 requires an internal power supply. For the powered cases, the transmitter 10 either may include an internal power supply, or may tap power directly from the circuit 11 connected to the power distribution system.

Some aspects of the present invention are directed towards an improved transmitter used to induce a signal along trace wires and in circuit breakers. Some aspects of the present invention are directed towards an improved receiver used to sense a transmitted signal emanating from wires and circuit breakers. Some circuits used in a transmitter include a dissipative load such as a resistive load or a current source. Some circuits include a reactive load such as a coupled inductor or an LC resonant circuit.

Figure 2:
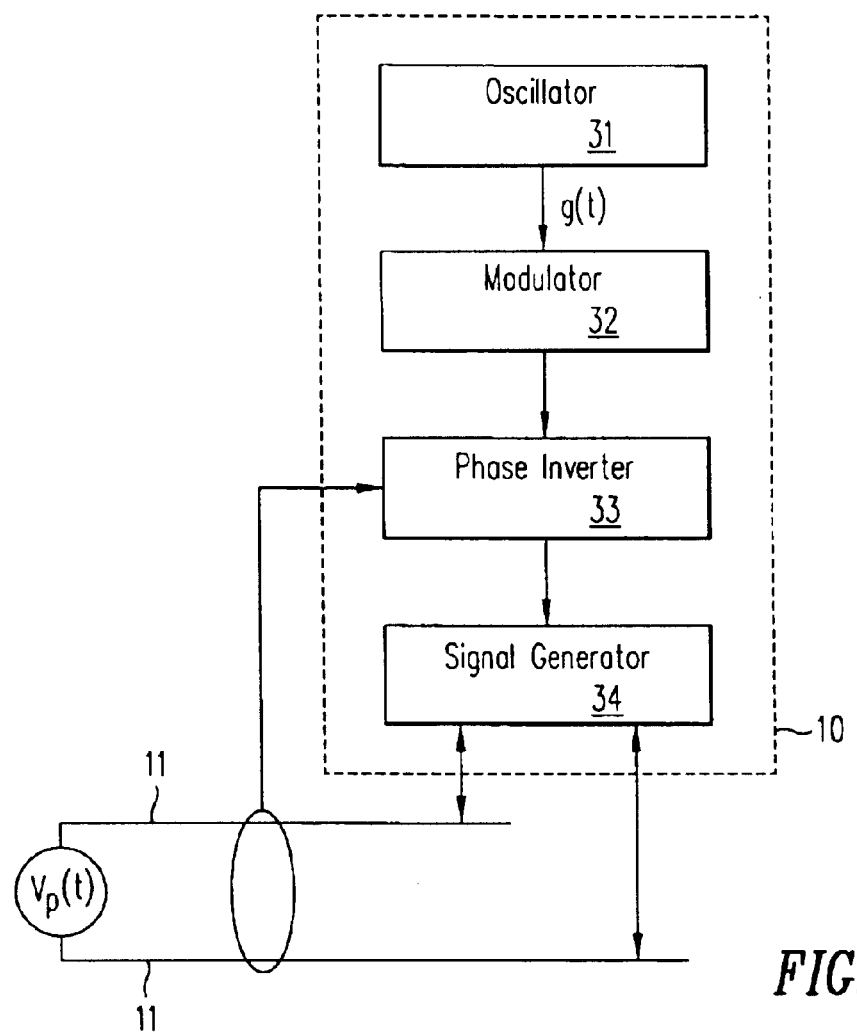
FIG. 2 is a block diagram of a transmitter in accordance with some embodiments of the present invention.

FIG. 2 is a block diagram of a transmitter in accordance with some embodiments of the present invention. The transmitter 10 includes an oscillator 31, an optional modulator 32, an optional phase inverter 33, and a signal generator 34. The transmitter 10 is electrically connected across one circuit 111 of a power distribution system.

The oscillator 31 of FIG. 2 provides a carrier signal with a frequency of $f_c$ to the modulator. The carrier signal may be any function, for example, a sinusoidal wave or a square wave, with a mid-range principal frequency between 120 Hz and 3900 Hz and may be set between a pair of adjacent harmonics of potential AC noise generators. By using a mid-range frequency $f_c$ below 3950 Hz, coupling among circuits is significantly reduced. By using a mid-range frequency $f_c$ between adjacent pairs adjacent of harmonics a 50 Hz, 60 Hz or 400 Hz power systems, discrimination and detection by a receiver 100 is enhanced. Additionally, a transmitter 10 and a receiver 100 pair tuned between pairs of adjacent harmonics of multiple power systems may be used on each of these types of power systems without retuning or adjustment. For example, a frequency $f_c$ of 930 Hz lies relatively evenly spaced between pairs of adjacent harmonics of both 50 Hz and 60 Hz power systems. Of course, many other frequencies that lie between pairs of adjacent power line harmonics, such as approximately 570 Hz, 630 Hz, 870 Hz, 1170 Hz, 1230 Hz and 1470 Hz, are also usable. The frequency $f_c$ may be generated in a variety of ways well known in the art. Components such as a crystal oscillator or a ceramic resonator may be used. Alternatively, the frequency may be synthesized from a powered line being sensed. Embodiments using a mid-range carrier frequency between 120 Hz and 3900 Hz and lying between a pair of adjacent harmonics may be better understood with reference to FIGS. 3A through 6D below.

The modulator 32 of FIG. 2 is also optional. If the modulator is not implemented, the carrier provided by the oscillator 31 passes to the phase inverter 33. If implemented, the modulator 32 performs additional signal conditioning, such as duty-cycle modulation. Duty-cycle modulation periodically allows the oscillator signal to pass. As a result, duty-cycle modulation can increase signal-to-noise ratio. The power dissipated by a transmitter 10 using duty-cycle modulation can be made the same as a conventional transmitter, however, duty-cycle modulation can produce a larger current signal. Duty-cycle modulation induces a current signal for only a fraction of each transmitted cycle. The time for a receiver 100 to acquire and process the signal is increased. Any number of other modulation schemes, for example, FSK, MSK, QPSK and spread spectrum, are possible. Duty-cycle modulation may be better understood with reference to FIGS. 7A and 7B below.

The phase inverter 33 of FIG. 2 is incorporated into some embodiments of the present invention. The phase inverter 33 may be operated before or after the modulator 32. The phase inverter 33 performs phase inverting or phase switching. The instantaneous polarity of the line may be sensed and a phase inverse signal imposed on the transmitted signal. The phase switching process may be implemented using combinational logic or an algorithm in a microcontroller or microprocessor. Phase switching prevents a carrier from being modulated as a function of the line frequency and confers two benefits: first, more of the current goes into the target frequency rather than being divided into side-bands; and second, the primary signal frequency received is not a function of line frequencies (e.g. 50, 60, or 400 Hz). Phase switching increase the first harmonics of the transmitted signal, thus increasing the probability of detection by the receiver 100. Phase inverting or phase switching may be better understood with reference to FIGS. 8A through 8E below.

Figure 3A:
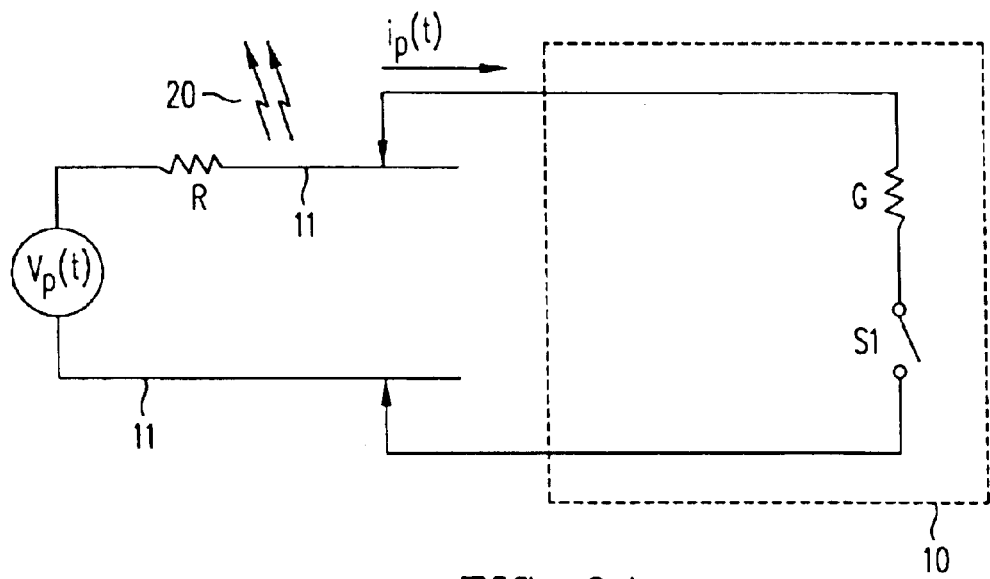
FIGS. 3A through 3D show a schematic diagram of a switched-resistive load transmitter and conductance voltage, and current waveforms in accordance with the some embodiments of the present invention.
Figure 4A:
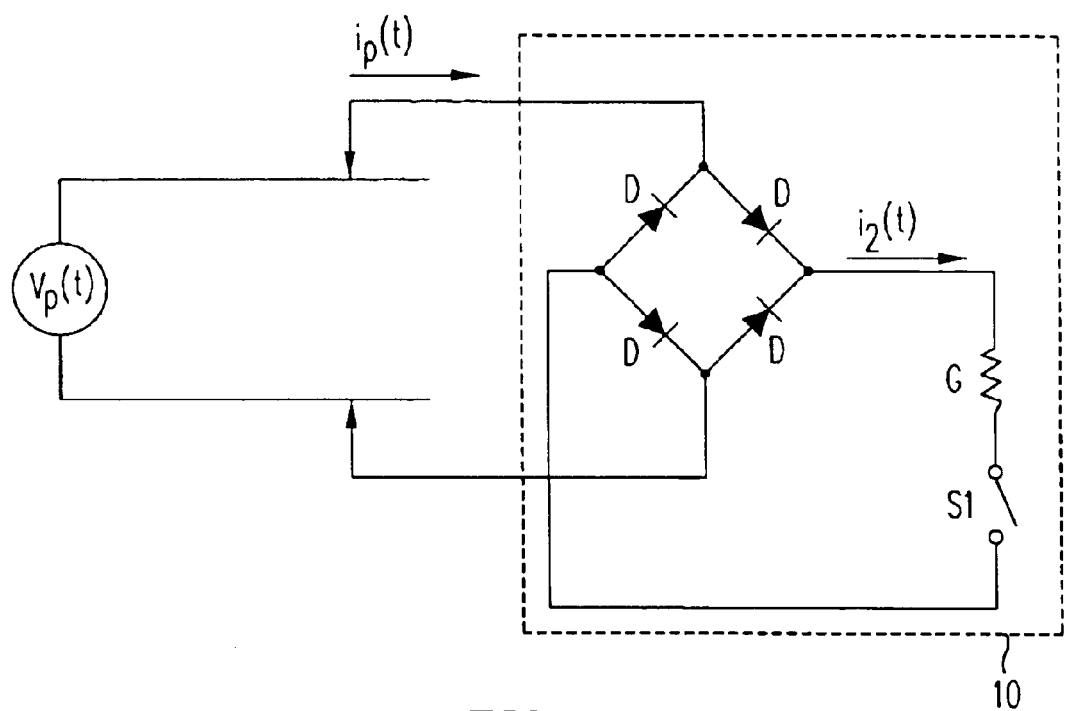
FIGS. 4A through F show a schematic diagram of another switched-resistive transmitter and conductance voltage, and current waveforms in accordance with the some embodiments of the present invention.
Figure 5:
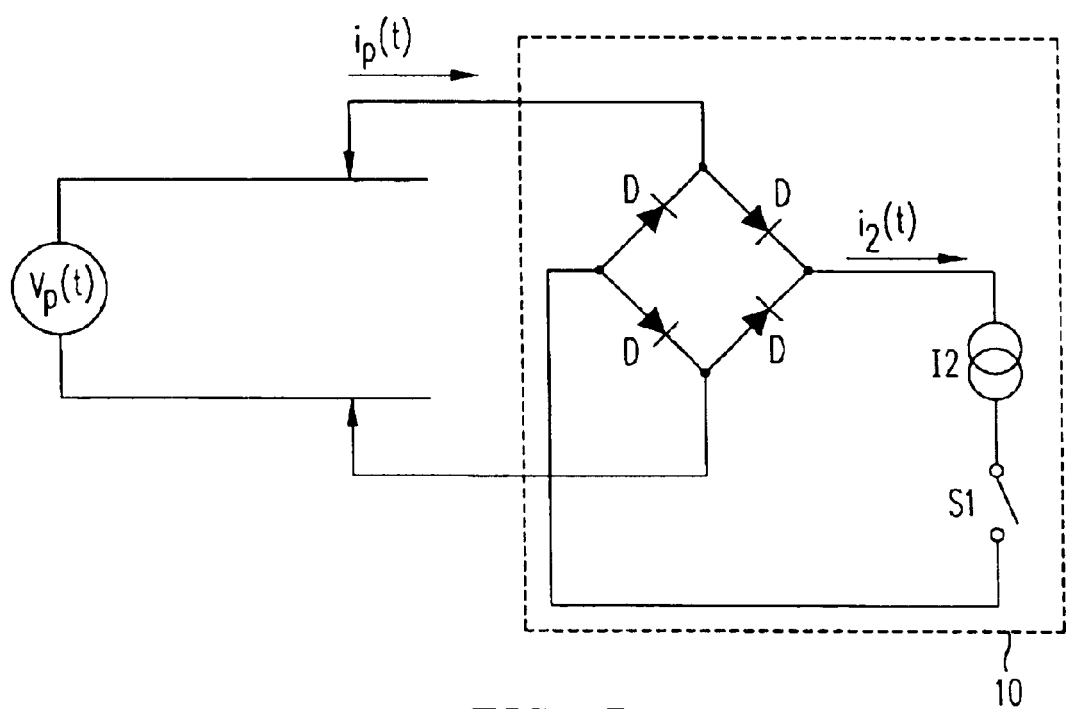
FIG. 5 shows show a schematic diagram of a current source transmitter in accordance with the some embodiments of the present invention.
Figure 9A:
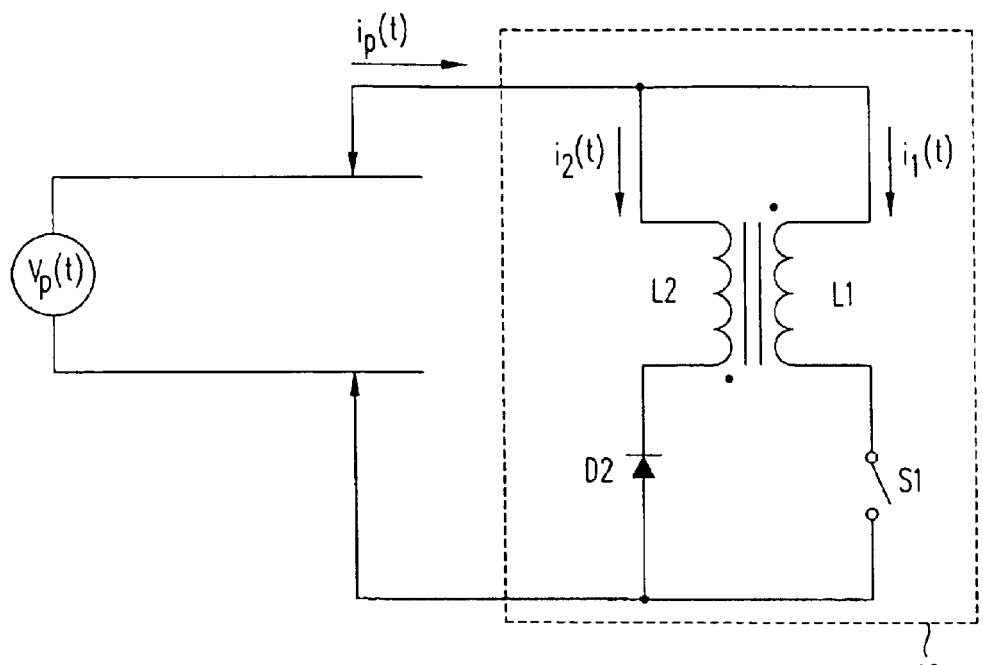
FIGS. 9A through 9C show a schematic diagram of a DC coupled-inductor transmitter and associated waveforms in accordance with some embodiments of the present invention.
Figure 10A:
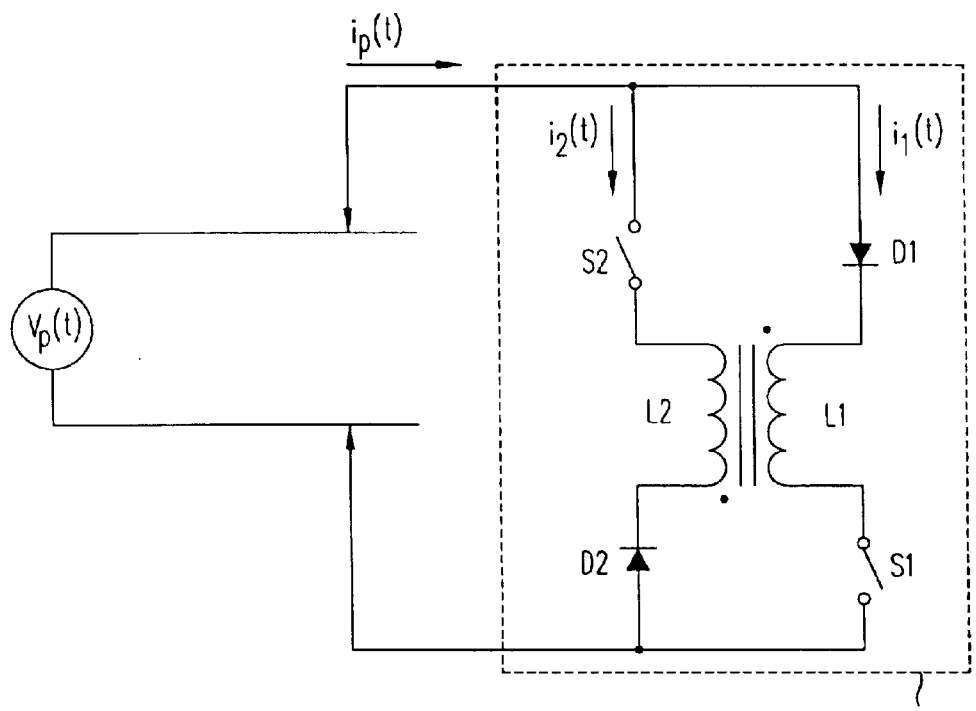
FIGS. 10A through 10E show a schematic diagram of AC coupled-inductor transmitter and associated waveforms in accordance with some embodiments of the present invention.
Figure 11A:
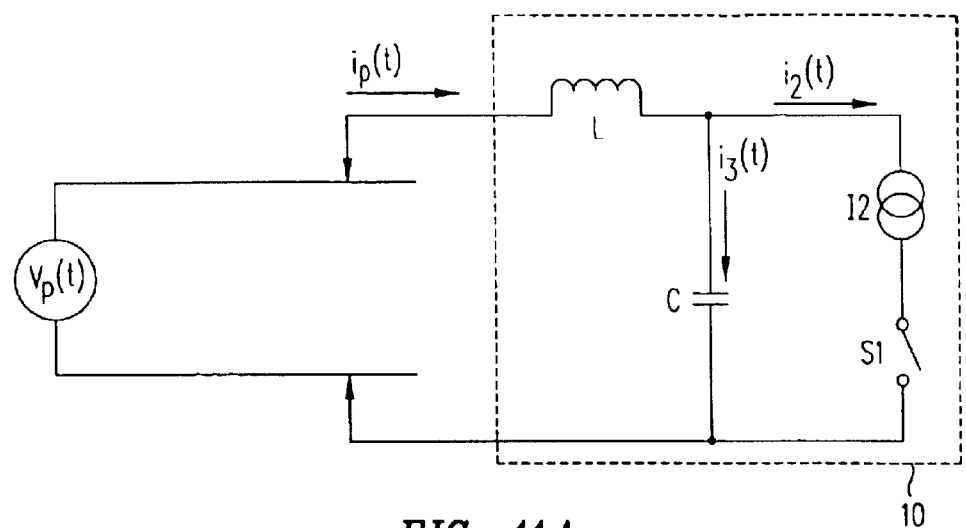
FIGS. 11A through 11C show a schematic diagram of a current-pump resonant-circuit transmitter and associated waveforms in accordance with some embodiments of the present invention.

The signal generator 34 of FIG. 2 may be either a dissipative load or a reactive load such as a switched-resistive load (as shown in FIGS. 3A and 4A), a switch-current source (as shown in FIG. 5), a switched coupled inductor (as shown in FIGS. 9A and 10A), or an LC resonant circuit (as shown in FIG. 11A). The signal generator 34 of FIG. 2 may be better understood with reference to the description below.

In the following equations, the relative phase between the switched load g(t) and the line voltage $v_p(t)$ is ignored for mathematical convenience. The results focus on the relative magnitudes of various frequency components.

Figure 3B:
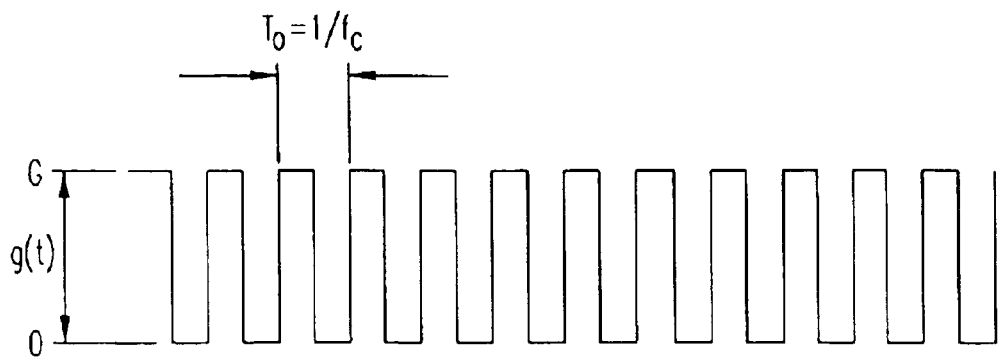

FIGS. 3A, 4A and 5 are schematic diagrams of transmitters in accordance with some embodiments of the present invention. FIG. 3A shows a simple transmitter including a switched-resistive load transmitter with conductance G. Conductance G is applied to the circuit by a switch S1 switching ON and OFF at a carrier frequency of $f_c$ having a period of $T_0=1/f_c$. The carrier frequency $f_c$ controls switch S1 such that the conductance G appears as represented in FIG. 3B. When the switch is not conducting (OFF), the conductance is zero. When the switch is conducting (ON), the conductance is G. A resistive load with conductance of $G=(1/R)$ [mhos] is switched at frequency $f_c=\omega_c/2\pi$. The resulting switched conductance signal $g(t)=G*\text{square}(\omega_c)$ appears as a square wave with a conductance of G for the first-half of the duty-cycle and zero mhos for the second-half of the duty-cycle.

Multiple factors are considered when selecting the value of the carrier frequency $f_c$. Carrier frequency $f_c$ selected may be selected such that the value lies between a pair of adjacent harmonics of various power systems. By selecting a frequency $f_c$ between a pair of adjacent harmonics of a power system, the sensitivity requirements for a receiver's detection circuitry are lessened. By selecting a frequency $f_c$ that lies between the various pairs of adjacent harmonics of different power systems, the transmitter/receiver pair may be used in various geographic locations using different power line frequencies.

Common power systems m the United States use a 60 Hz line frequency. Harmonics of these systems lie at multiples of 60 Hz (e.g., 120 Hz, 180 Hz, 240 Hz and 300 Hz). Candidate carrier frequencies that lie between a pair of adjacent harmonics of a U.S. system are approximately 90 Hz, 150 Hz, 210 Hz, 270 Hz and so on. Common power systems in Europe use a 50 Hz line frequency. Harmonics of these systems lie at multiples of 50 Hz (e.g., 100 Hz, 150 Hz, 200 Hz, 250 Hz and 300 Hz). Candidate carrier frequencies that lie between a pair of adjacent harmonics of a European system are approximately 75 Hz, 125 Hz, 175 Hz, 225 Hz and so on. Candidate carrier frequencies that lie between a pair of adjacent harmonics of both 50 Hz and 60 Hz include approximately 80 Hz, 165 Hz, 220 Hz, 270 Hz, 330 Hz, 380 Hz and so on.

The carrier frequency $f_c$ selected may also be selected such that the value is a mid-range between frequency, that is, a frequency between 120 Hz and 3900 Hz. The power spectrum from DC to 120 Hz of a typical power system often includes excessive noise. As the carrier frequency is increased a transmitted signal more easily couples to neighboring circuits. Coupling to neighboring circuits is undesirable but some coupling capability is necessary because a transmitted signal must at least couple to a receiver's antenna in order for the receiver to sense the transmitted signal. As the carrier frequency increases, the likelihood that a transmitted signal will be detected also increases, however, at the cost of stronger coupling to neighboring circuits. Above approximately 4000 Hz, inexpensive receivers can be built to receive the coupling transmitted signal. Below approximately 3900 Hz, the typical transmitters an receivers are less efficient and are not sensitive enough to detect the transmitted signal.

The more efficient transmitter/receiver pair of the present invention balances the need for coupling by way of improved transmission and reception techniques. Preferably, a selected carrier frequency $f_c$ lies between approximately 240 Hz and 2000 Hz and lies relatively evenly spaced between adjacent harmonics of each 50 Hz, 60 Hz and 400 Hz power systems.

Figure 3C:
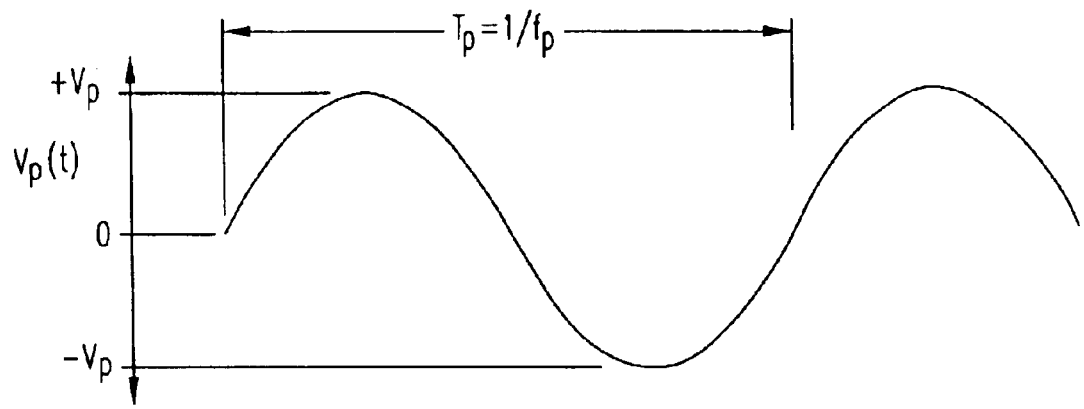

FIG. 3C shows the voltage $v_p(t)$ supplied by an AC power network having a period of $T_p=1/f_p$. Ignoring the relative phases, the AC voltage signal $v_p(t)=V_p\cos(\omega_p t)$ is a sinusoidal wave at frequency $f_p=\omega_p/2\pi$. In a typical 50 Hz power network, voltage $v_p(t)$ has peaks at $\pm V_p$ equal to approximately $\pm 160$ volts (110 volts RMS) (e.g., Japan) or $\pm 325$ volts (220 volts RMS) (e.g., Europe). The period $T_p$ of a 50 Hz signal is approximately 20 milliseconds (msec). In a typical 60 Hz power network, voltage $v_p(t)$ has peaks at $\pm V_p$ equal to approximately to $\pm 160$ volts. The period $T_p$ of a 60 Hz signal is approximately 16.7 msec.

Figure 3D:
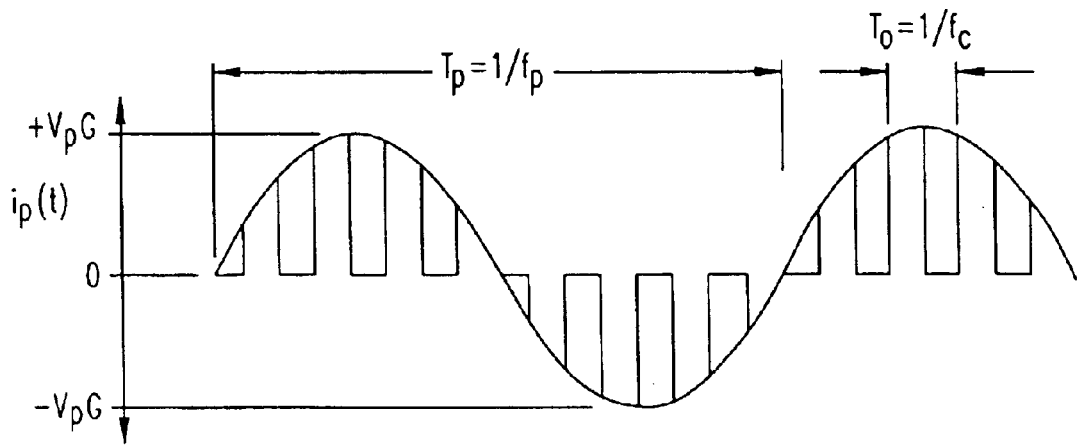

Current $i_p(t)$ through the resistive load creates a voltage drop of approximately $V_p$ across the resistive load G. Applying Ohm's law, a current through the resistive load appears as a pulsed current $i_p(t)$ that follows the envelope of $v_p(t)$ and is scaled by the product of voltage $v_p(t)$ and switched conductance G through the switch as shown in FIG. 3D. The current $i_p(t)$ is induced on the pair of conductors making up the circuit 11 to be tested. The cumulative resistance in the circuit 11 and of the non-ideal components of the transmitter 10 is represented by resistor R. The cumulative resistance R, though not shown in subsequent schematic diagrams, is assumed to be present. The induced current $i_p(t)$ creates electromagnetic radiation 20 that a receiver 100 is designed to sense. Here, the analysis was shown for the AC power case. A similar analysis may also be applied if the voltage source $v_p(t)$ represents a DC power source or an un-powered closed circuit.

FIG. 4A shows an alternative embodiment to the simple transmitter of FIG. 3A. The circuit includes a switched-resistive load with conductance G that induces a current $i_2(t)$ on to the line through a full-wave bridge rectifier having four diodes D. One advantage of using a rectifier is that the bi-directional switch may be replaced with a unipolar switch S1 that can be implemented with a single FET, a single power MOSFET or a single bipolar transistor.

Figure 4B:
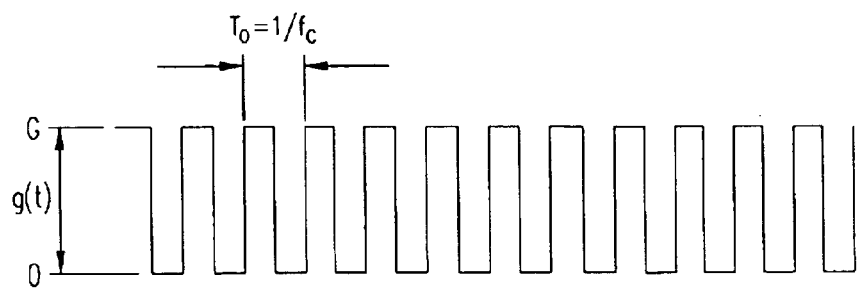
Figure 4C:
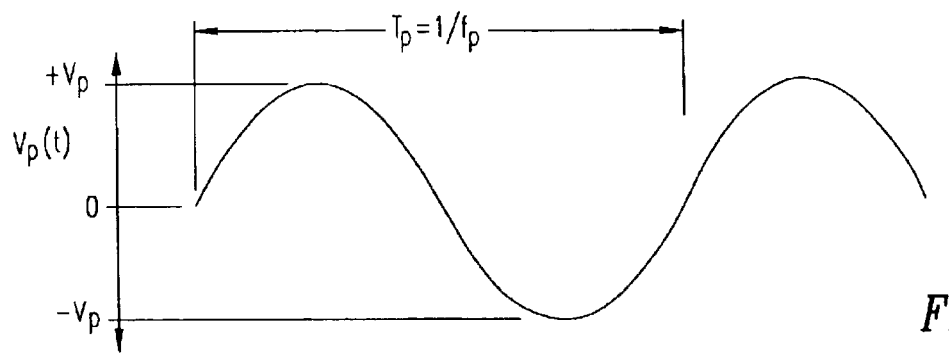
Figure 4D:
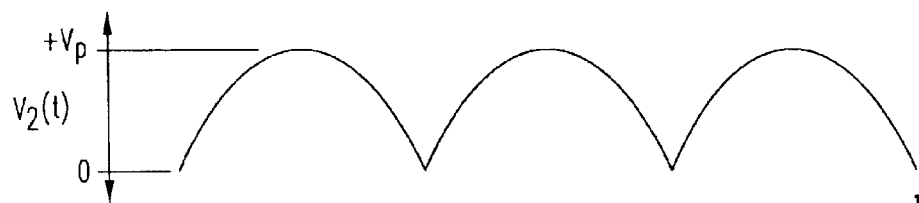
Figure 4E:
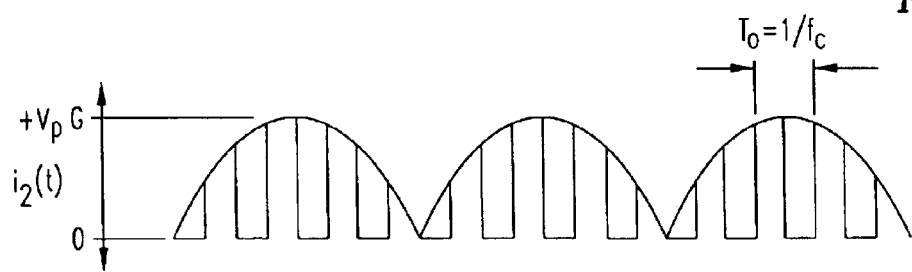

FIG. 4B shows the transmitter's conductance g(t) as the switch opens and closes. FIG. 4C shows the voltage $v_p(t)$ supplied by the power system. FIG. 4D shows the rectified voltage $v_2(t)$ after the full-wave rectifier and before the switched conductor. FIG. 4E shows the current $i_2(t)$ through the switch S1. Following Ohm's law, current $i_2(t)$ is the product between the switched conductance g(t) and the rectified voltage $v_2(t)$. Current $i_2(t)$ passes through the rectifier producing current $i_p(t)$, which induces electromagnetic waves 20 that emanate from circuit 11.

Figure 4F:
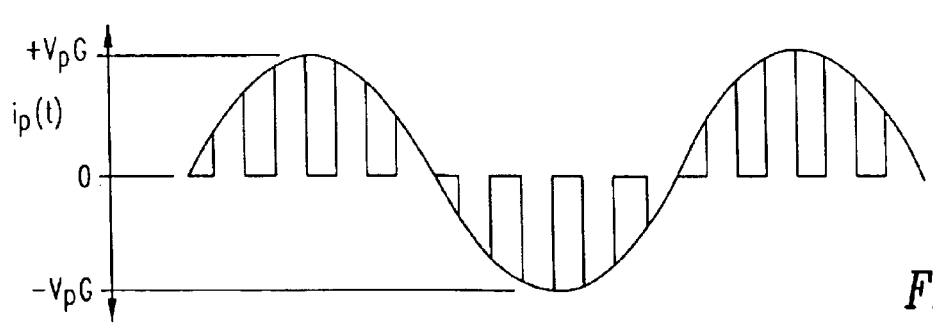

FIG. 4F shows the induced current $i_p(t)$ for a switched-resistive load transmitter applied to an AC power system. The current appears as a pulse train scaled by the envelope of the AC power and by the conductance G of the resistive load.

FIG. 5 shows an alternative embodiment to the transmitter of FIG. 4A. The resistor with conductance G in FIG. 4A is replaced with a current source I2. A switch S1 placed in series with the current source 12 defines a switched-current source. A switched-current source may be implemented with an emitter-follower style amplifier. The schematic diagram of FIG. 5 is further described with reference to the timing diagrams of FIGS. 6–8 described below.

Figure 6A:
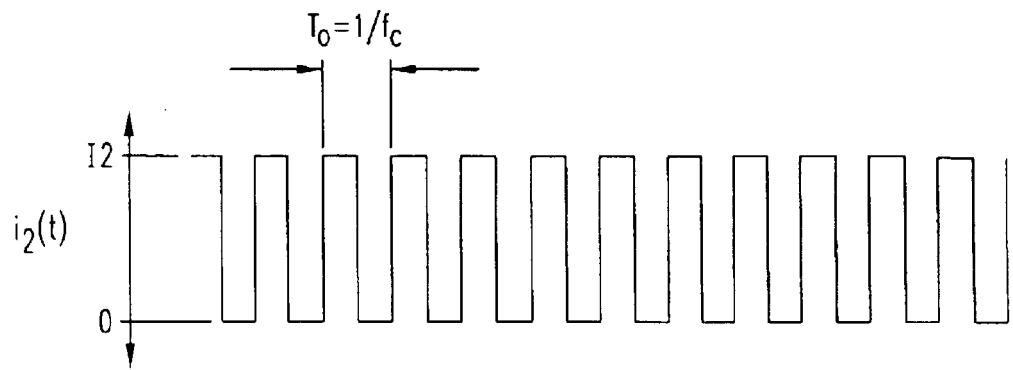
FIGS. 6A through 6D show current and voltage waveforms in accordance with the transmitter of FIG. 5.
Figure 6B:
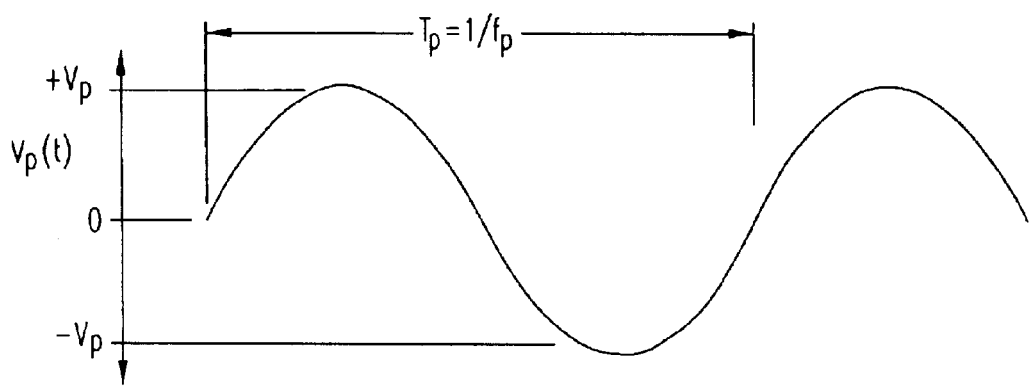
Figure 6C:
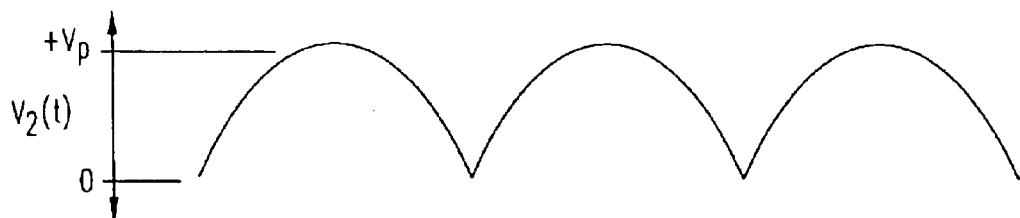

FIG. 6A shows the current $i_2(t)$ switching on and off at the carrier frequency $f_c$. FIGS. 6B and 6C show the voltages before and after the rectifier as described above.

Figure 6D:
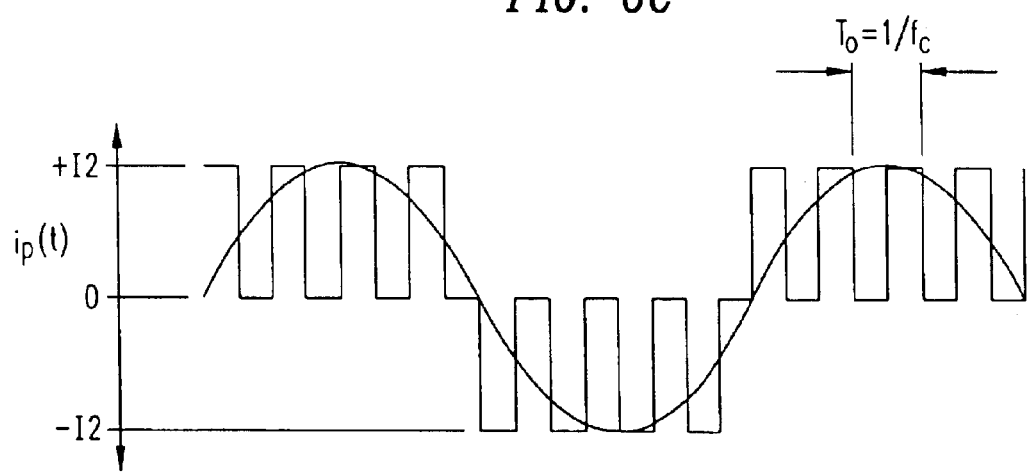

FIG. 6D shows the current $i_p(t)$ that is induced on circuit 11 by the transmitter 10. The current signal $i_2(t)$ generated by the current source and switch passes through the rectifier and appears as a pulse train with each pulse having a constant magnitude but a sign equaling the sign of the AC power system's voltage $v_p(t)$. Unlike cases using a resistive load, the amplitude of current $i_p(t)$ using a current source is a function of the sign and not of the amplitude of $v_p(t)$.

According to some embodiments, for each of the circuits shown, the carrier frequency may be set at a mid-range and the carrier frequency selected may be centered between a pair of adjacent harmonics. Additionally, duty-cycle modulation and phase-switching, shown below, may be used.

Figure 7A:
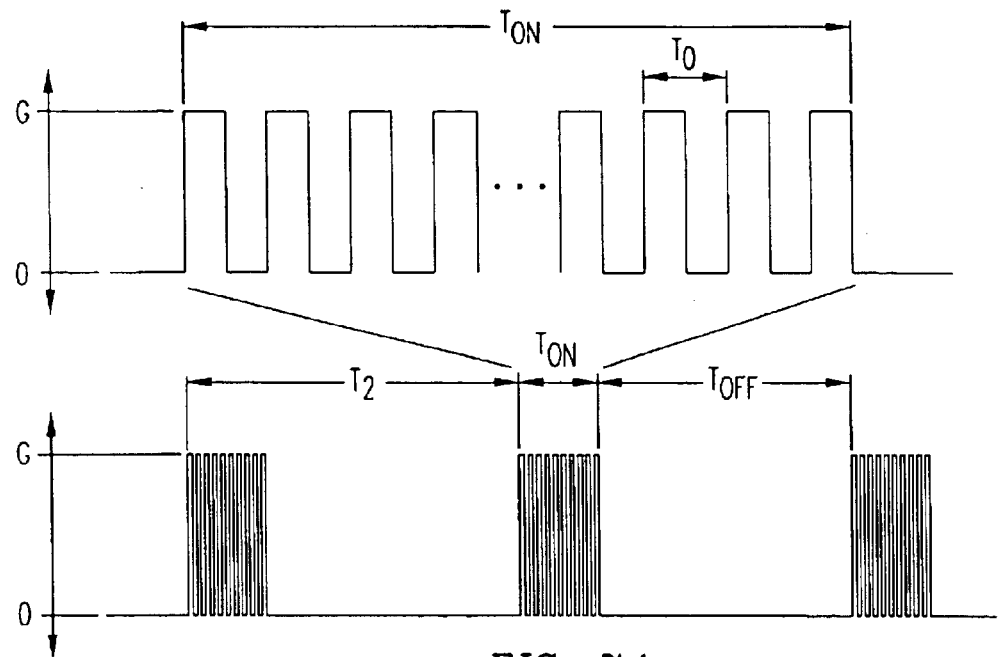
FIGS. 7A through 7B show duty-cycle conductance and current waveforms in accordance with the transmitter of FIG. 3A.
Figure 7B:
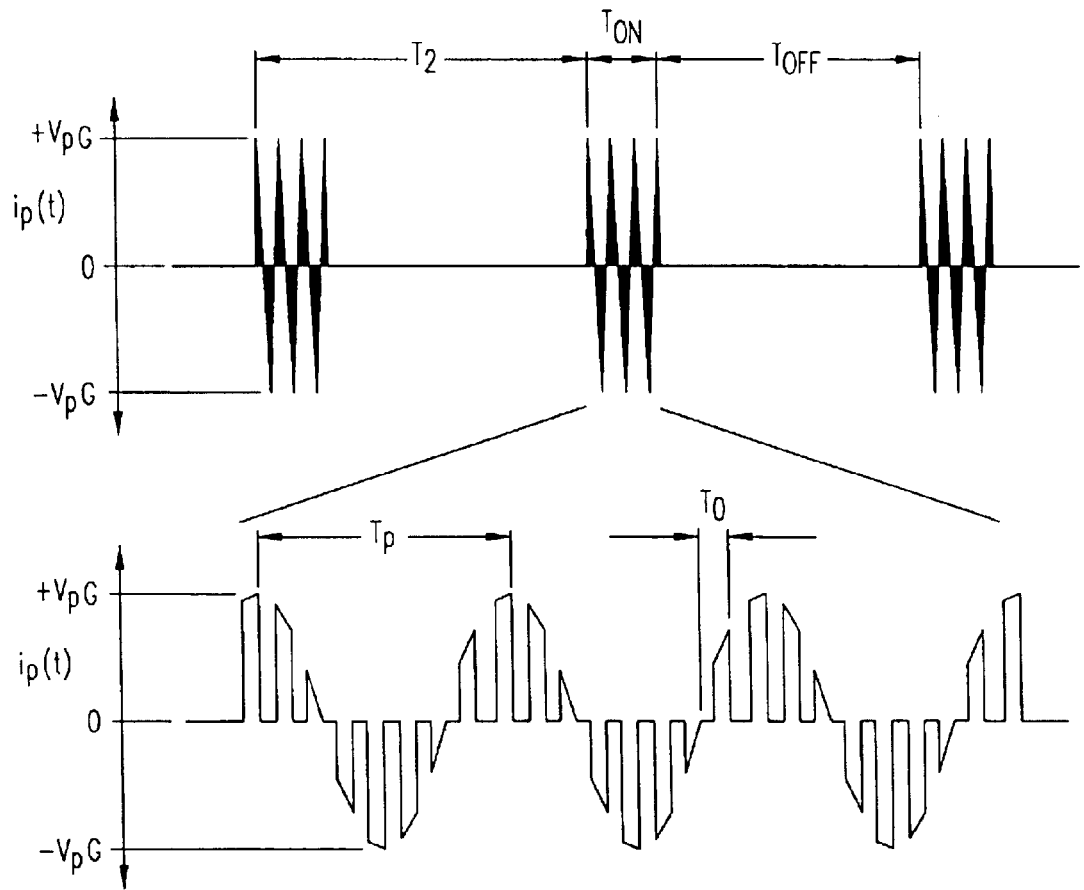

FIGS. 7A through 7B show duty-cycle conductance and current waveforms in accordance with the schematic diagram of FIG. 3A. Every $T_2$ seconds, the modulator 32 of FIG. 2 switches on (enables) the conductance g(t) pulse train for a period of $T_{ON}$ seconds, as shown in FIG. 7A. After $T_{ON}$ seconds, the modulator 32 halts (disables) the pulse train for a period of $T_{OFF}$ seconds. The ration of $T_{ON}$ to $T_{OFF}$ ranges from 1:1 to 1:10. A ration of $T_{ON}:T_{OFF}=1:1$ represents a 50% ON duty-cycle and allows a receiver to reduce the amount of time it needs to provide an update. A ration of $T_{ON}:T_{OFF}=1:10$ represents approximately a 9% ON duty-cycle and reduces power dissipation in a transmitter and allows the transmitter to place a greater amount of power in the transmitted burst of pulses. The sum of $T_{ON}$ and $T_{OFF}$ defines $T_2$. The period $T_2$ is also limited by estimated patience of an operator, that is, by the amount of time that an operator will be expected to wait between updates. Additionally, the ratio between $T_{ON}$ and $T_0$ ranges from 50:1 to 500:1, thus allowing 50 to 500 pulse of length $T_0$ in each ON period $T_{ON}$.

For example, with a carrier frequency $f_c=930$ Hz, $T_0$ equals approximately 1 msec, $T_{ON}$ ranges approximately from 50 msec to 500 msec, and $T_{OFF}$ ranges approximately from 50 msec to 1 second. In some embodiments, the carrier frequency $f_c=930$ Hz, $T_{ON}$ equals approximately 250 msec and $T_{OFF}$ equals approximately 750 msec, thus resulting in a 25% duty-cycle.

FIG. 7B shows the resulting current $i_p(t)$ induced on circuit 11. If using switched conductance, the current $i_p(t)$ will follow the envelope of the voltage $v_p(t)$ but scaled by the conductance G as shown. When the conductance g(t) is zero between groups of pulses, the current $i_p(t)$ will also be zero. The implementation of duty-cycle modulation to the schematic of FIG. 3A is exemplary only and is not meant to limit other implementations. If the conductance G of FIG. 3A is replaced with the current source of FIG. 5, a similar current $i_p(t)$ results; however, the sinusoidal envelope is removed leaving a constant envelope.

FIGS. 8A through 8E show phased-switched conductance and current waveforms in accordance with the schematic diagram of FIG. 3A. FIG. 8A shows the voltage $v_p(t)$ supplied by the power system. FIG. 8B shows $m_\phi(t)$, which represents the sign of $v_p(t)$. FIG. 8C shows the transmitter's conductance g(t) before phase-switching. FIG. 8D shows the transmitter's conductance $g_\phi(t)$ after phase-switching. The transmitter's conductance $g_\phi(t)$ is produced by the product of $m_\phi(t)$ and g(t). FIG. 8E shows the current $i_p(t)$ induced on circuit 11. The current $i_2(t)$ is the product between the switched conductance $g_\phi(t)$ and the voltage $v_p(t)$. Current $i_2(t)$ passes through the rectifier producing current $i_p(t)$, which induces electromagnetic waves 20 in the circuit 11. If the current source of FIG. 5 replaces the conductor, the currents $i_2(t)$ and $i_p(t)$ do not follow the envelope of $v_p(t)$.

Without phased-switching, a classical modulator modulates a signal x(t) with a sinusoidal carrier signal s(t) at frequency $f_s = \omega_s/2\pi$. If the signal x(t) is also a sinusoidal wave but at frequency $f_x = \omega_x/2\pi$, where $f_x < f_s/2$, the resulting frequency domain components of x(t)*s(t) have equal magnitude lying at frequencies $(f_s \pm f_x)$ and $-(f_s \pm f_x)$. If x(t) represents $v_p(t)$, then, to first order, the square wave signal switched load g(t) at frequency $f_c$ equals the sinusoidal signal s(t) at frequency $f_s$ when frequency $f_c = f_s$. Therefore, without phased-switching, the classical modulation produces frequency domain components at frequencies $(f_c \pm f_p)$ and $-(f_c \pm f_p)$.

Typical distribution systems operate at a line at frequency $f_p$ of 50 Hz, 60 Hz or 400 Hz. With a domestic or industrial power system in the U.S., the line provides a signal with frequency with $f_p = 60$ Hz. A load frequency of $f_c = 870$ Hz results in signals at $(f_c \pm f_p)$ of 810 Hz and 930 Hz. The energy in the resulting signal is equally split and the transmitted frequencies are dependent on the line frequency $f_p$ of the power system.

A Fourier series expansion of the conductance g(t) shown in FIG. 3B is $$g(t) = a_0 + \sum_{n=1}^{\infty} a_n \times \sin((2n-1)\omega_g t)$$

where $$a_0 = \frac{G}{2}$$

$$a_n = \frac{2G}{\pi(2n-1)}$$

The current $i_p(t)$ induced on the line is:

$$i_p(t) = v_p(t) \cdot g(t)$$

$$= (V_p \cdot \cos(\omega_p t)) \cdot \left(a_0 + \sum_{n=1}^{\infty} a_n \cdot \sin((2n-1)\omega_g t)\right)$$

$$= V_p \cdot a_0 \cdot \cos(\omega_p t) + \sum_{n=1}^{\infty} a_n \cdot V_p \cdot \cos(\omega_p t) \cdot \sin((2n-1)\omega_g t)$$

with $$\sin A \cos B = \frac{1}{2}\sin(A+B) + \frac{1}{2}\sin(A-B)$$

then $$i_p(t) = V_p \cdot a_0 \cdot \cos(\omega_p t) + \sum_{n=1}^{\infty} \frac{a_n \cdot V_p}{2} \cdot \{\sin((2n-1)\omega_g t + \omega_p t) - \sin((2n-1)\omega_g t - \omega_p t)\}$$

The magnitude of the first harmonic is $(a_n V_p/2)$ which equals $(GV_p/\pi)$. To reduce the impact of the line frequency, the switching of the load can be modified by using phase inversion to shift the energy from frequencies at $(f_s \pm f_x)$ to a frequency of $f_s$.

By replacing conductance g(t) with phase-switched conductance $g_\phi(t)$, the current $i_p(t)$ induced on the line becomes:

$$g_\phi(t) = m_\phi(t) \cdot g(t)$$

and $$i_p(t) = v_p(t) \cdot g_\phi(t)$$

$$= (V_p \cdot \cos(\omega_p t)) \cdot \left(m_\phi(t) \cdot \left(a_0 + \sum_{n=1}^{\infty} a_n \cdot \sin((2n-1)\omega_g t)\right)\right)$$

$$= V_p \cdot m_\phi(t) \cdot a_0 \cdot \cos(\omega_p t) + m_\phi(t) \cdot \sum_{n=1}^{\infty} a_n \cdot V_p \cdot \cos(\omega_p t) \cdot \sin((2n-1)\omega_g t)$$

with $$m_\phi(t) \cdot \cos(\omega_p t) = |\cos(\omega_p t)|$$

then $$i_p(t) = V_p \cdot a_0 \cdot |\cos(\omega_p t)| + |\cos(\omega_p t)| \cdot \sum_{n=1}^{\infty} a_n \cdot V_p \cdot \sin((2n-1)\omega_g t)$$

with $$V_p \cdot |\cos(\omega_p t)| = b_0 + \sum_{n=1}^{\infty} b_n \cdot \cos((2n-1)\omega_g t)$$

then $$i_p(t) = a_0 \cdot V_p \cdot |\cos(\omega_p t)| + \left(b_0 + \sum_{n=1}^{\infty} b_n \cdot \cos((2n-1)\omega_g t)\right) \cdot \sum_{n=1}^{\infty} a_n \cdot \sin((2n-1)\omega_g t)$$

$$= a_0 \cdot V_p \cdot |\cos(\omega_p t)| + \sum_{n=1}^{\infty} a_n \cdot b_0 \cdot \sin((2n-1)\omega_g t) +$$

$$\sum_{n=1}^{\infty} b_n \cdot \cos((2n-1)\omega_g t) \cdot \sum_{m=1}^{\infty} a_m \cdot \sin((2m-1)\omega_g t)$$

$$= a_0 \cdot V_p \cdot |\cos(\omega_p t)| + \sum_{n=1}^{\infty} a_n \cdot b_0 \cdot \sin((2n-1)\omega_g t) +$$

$$\sum_{n=1}^{\infty} \sum_{m=1}^{\infty} a_m b_n \cdot \sin((2m-1)\omega_g t) \cdot \cos((2n-1)\omega_g t).$$

Therefore, the amplitude of the spectral component of $i_p(t)$ at $\omega_g$ is $(a_1 b_0)$, which equals $(2V_p/\pi)*(2V_p/\pi) = (4V_p G/\pi^2)$. That is, when using phase switching the magnitude of the first harmonic is $(4GV_p/\pi^2)$. The ratio of the non-phaseswitched first harmonic magnitude ($a_n V_p/2$) and phase-switched first harmonic magnitude ($4GV_p/\pi^2$) shows that phase-switching provides a 27% improvement in amplitude over an equivalent non-phase-switched implementation.

Similarly, for the current source circuit of FIG. 5, the amplitude of the first harmonics can be shown to be ($4I_0/\pi^2$) without phase shifting and ($2I_0/\pi$) with phase shifting, thus providing a theoretical improvement of approximately 57%.

Features described above, namely: (1) use of a carrier frequency set at a mid-range; (2) use of a carrier frequency centered between a pair of adjacent harmonics; (3) use of duty-cycle modulation; (4) use of phase-switching; may be applied in conjunction with a dissipative load (e.g., a resistive load or a current source, described above) or with a reactive load (e.g., coupled inductors and LC resonant circuits, described below). These features may also be combined with one another. For example, a mid-range carrier frequency centered between a pair of adjacent harmonics may use a circuit including a dissipative load or a reactive load.

The techniques described above may be replaced or supplemented with the two reactive techniques described below. The first reactive technique uses the magnetic field of mutually coupled inductors to store and discharge energy and is shown for both the DC and AC cases. The second reactive technique uses a series resonant circuit.

FIG. 9A is a schematic diagram of a DC coupled-inductor transmitter in accordance with some embodiments of the present invention. The voltage source $v_p(t)$ is assumed to be a DC voltage source. Two magnetically coupled inductors L1 and L2 are coupled with reverse polarities. A first chain includes an inductor L1 and a switch S1 connected in series. A second chain includes an inductor L2 and a diode D2 connected in series. The two chains are connected in parallel with the DC power source having voltage $v_p(t)$.

Figure 9B:
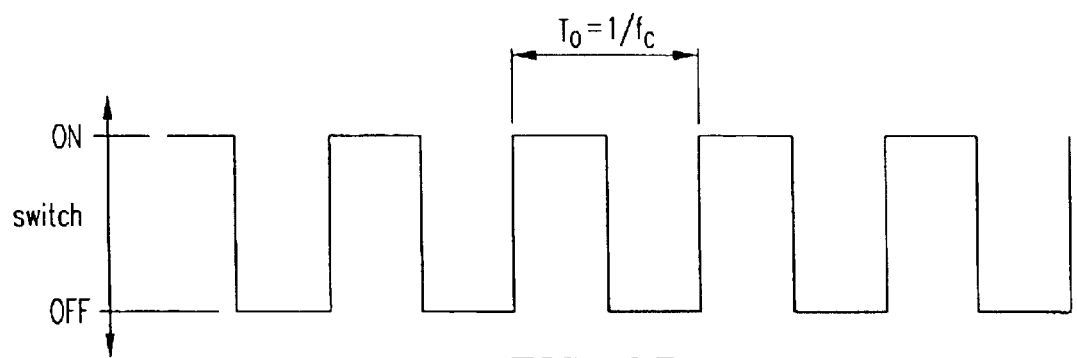
Figure 9C:
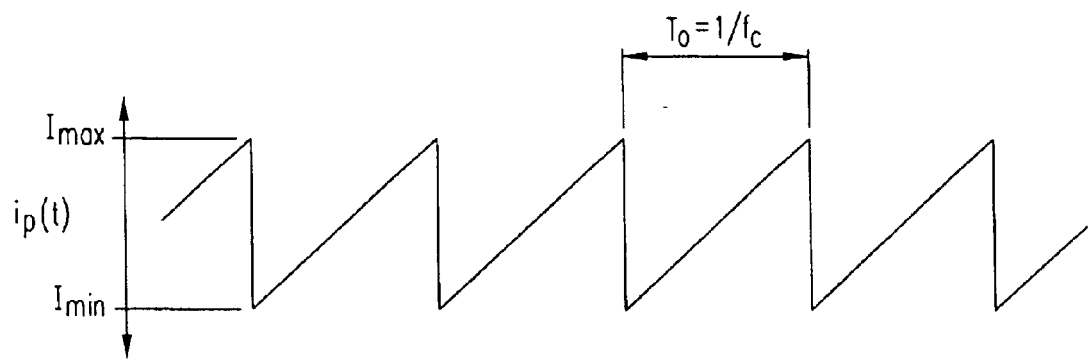

FIGS. 9B and 9C show switch position and current waveforms in accordance with the schematic diagram of FIG. 9A. FIG. 9B shows the position of switch S1 relative to FIG. 9C. The waveforms assume switch S1 is open (turned OFF) at time t<0, there is ideal coupling between L1 and L2, and there is equality of the self-inductance. When S1 is closed (turned ON), a current $i_p(t)=I_1$, begins to flow with the indicated polarity. When S1 is subsequently opened (turned OFF), the collapsing magnetic field causes a current $i(t)=-I_2$ to flow. From an energy perspective, energy accumulates in the magnetic field during the period when the switch S1 is closed (turned ON) and released when the switch S1 is opened (turned OFF). A receiver 100 may be used to detect electromagnetic radiation emanating from the circuit 11 as a result of the saw tooth current $i_p(t)$. This coupled-inductor technique shown for a DC case may be extended to an AC case source as show in FIG. 10A.

FIG. 10A is a schematic diagram of an AC coupled-inductor transmitter in accordance with some embodiments of the present invention. The voltage source $v_p(t)$ is assumed to be an AC voltage source. Two magnetically coupled inductors L1 and L2 are coupled with reverse polarities as with the DC case. A first chain includes an inductor L1, a switch S1 and a diode D1 connected in series. A second chain includes an inductor L2, a switch S2 and a diode D2 connected in series. The two chains are connected in parallel with the AC power source having voltage $v_p(t)$.

Figure 10B:
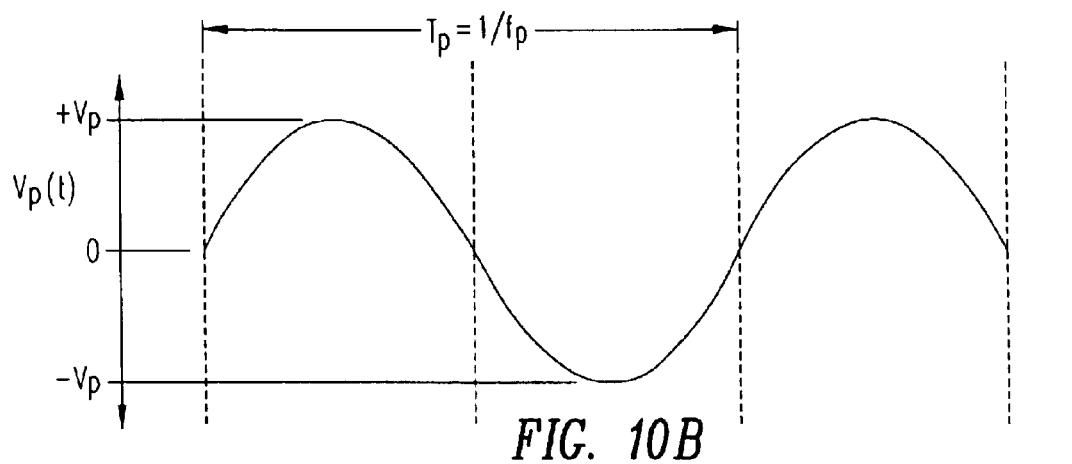
Figure 10C:
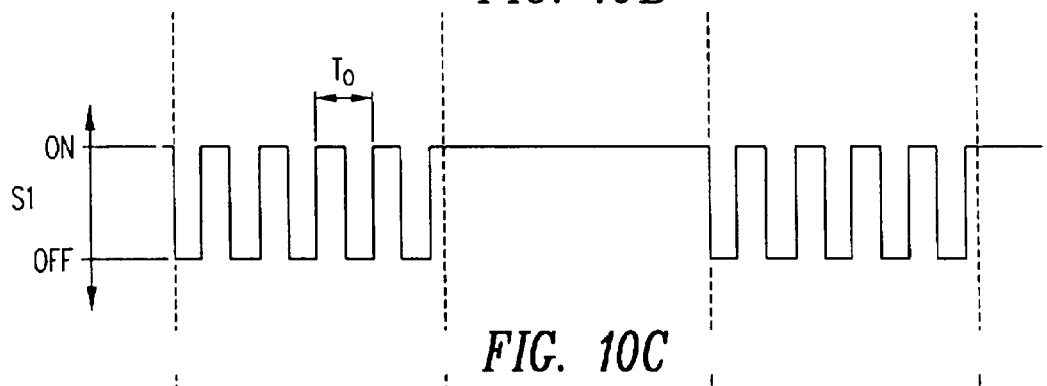
Figure 10D:
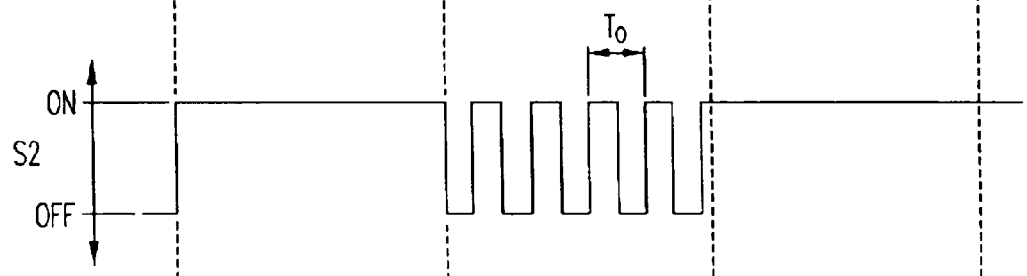
Figure 10E:
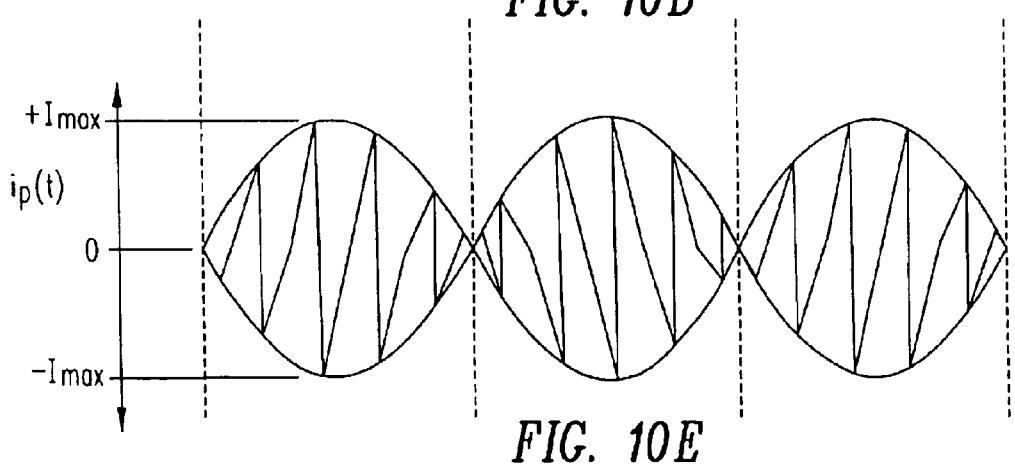

FIGS. 10B through 10E show switch positions as well as voltage and current waveforms in accordance with the schematic diagram of FIG. 10A. FIG. 10B shows the voltage $v_p(t)$ supplied by an AC power network having a period of $T_p=1/f_p$. Again, the switching frequency (carrier frequency $f_c$) is assumed to be substantially greater than the frequency of the power signal. FIGS. 10C and 10D show the switching of switch S1 and S2. While the polarity of $v_p(t)$ is positive, switch S2 is held in the connected position and switch S1 is actively modulating the current by turning ON and OFF at the selected carrier frequency. While the polarity of $v_p(t)$ is positive, the circuit operates substantially as described with the DC case above. When the polarity of $v_p(t)$ changes from positive to negative, switch S1 is held in the connected position and switch S2 begins a actively modulating the current by turning ON and OFF at the selected carrier frequency. While the polarity of $v_p(t)$ is negative, the circuit operates equivalent via symmetry. FIG. 10E shows the resulting current signal $i_p(t)$ induced on the circuit 11.

FIG. 11A is a schematic diagram of a resonant-circuit transmitter in accordance with some embodiments of the present invention. In accordance with other embodiments of the present invention, a reactive system uses a series-resonant circuit to share energy storage between magnetic and electrical fields. An inductor L is connected is series to a capacitor C. A current-source I2 is connected in series with a switch S1. The current-source I2 and switch S1 are connected in parallel across the capacitor C. The power system provides an AC voltage $v_p(t)$ and the circuit induced a current $i_p(t)$ on to the circuit 11. The current source I2 and switch S1 define a switched current source.

The carrier frequency $f_c$ is selected as described above. The inductor L and capacitor C of the LC resonant circuit are selected to resonate at the carrier frequency $f_c$. The switched current source is switched ON and OFF at the rate of the carrier frequency $f_c$ and is used to inject a small amount of current into the LC circuit.

Figure 11B:
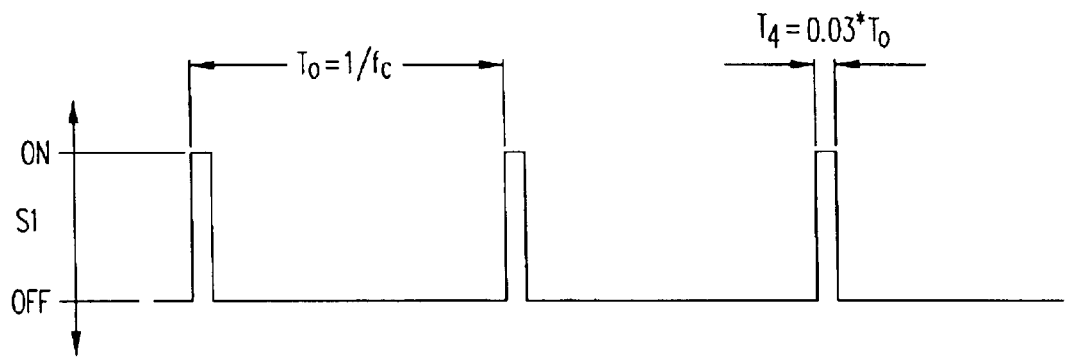
Figure 11C:
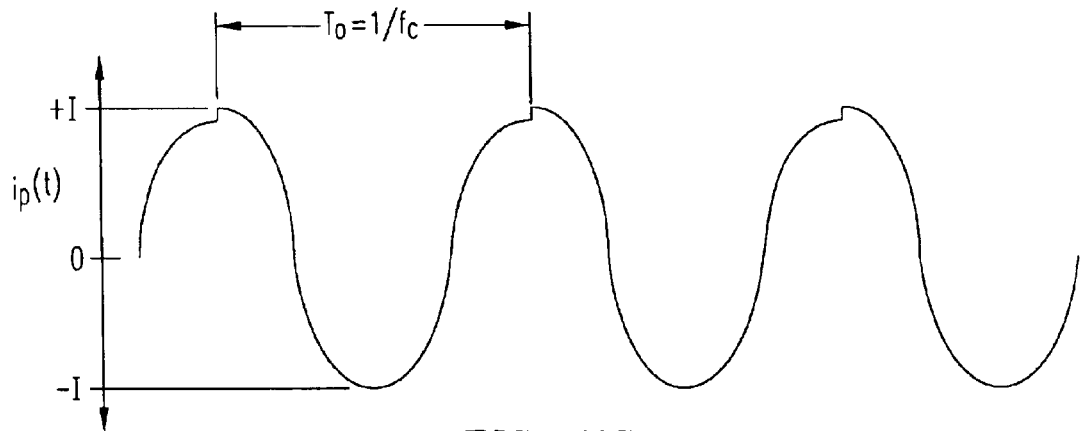

FIG. 11B shows the switch S1 ON and OFF transitions. The duty-cycle of the switch S1 is selected such that the injected current compensates for the natural and parasitic resistive elements of the transmitter 10 and circuit 11. If the switch is opened and closed at the resonant frequency $f_c$ of the series LC circuit, the energy lost is replenished. By adjusting the duty-cycle of the switch and the magnitude of the current source, a current $i_p(t)$ can be maintained at very nearly follows a sinusoidal wave with frequency $f_c$. In some embodiments the duty-cycle is approximately 3% ON. p FIG. 11C shows the current waveform in accordance with the schematic diagram of FIG. 11A. Generally, the LC circuit resonates at the carrier frequency $f_c$. In the ideal case, that is, without resistive losses, the LC circuit would continue to resonate once started. Assuming the ideal case for the LC circuit, the current $i_p(t)=A\sin(\omega_c t)$, where $f_c=2\pi\omega_c$ is the resonant frequency of the LC circuit and A is a scalar constant. The current $i_p(t)$ in will remain $A \sin(\omega_c t)$ for all time and there is no energy dissipated.

For the realistic case, wiring resistance, component imperfections, and parasitic resistances in the capacitor and inductor cause small amounts of power to dissipate from the LC circuit. If left unattended, the current envelope would slowly attenuate until no current was resonating in the LC circuit. If power is periodically injected into the circuit with the switched current source, the decaying current is replenished, thus maintaining a relatively constant current envelope.

The circuit shown in FIG. 11 works equally well with either DC or AC power sources. If the AC source frequency is much less than the resonant frequency. The only change is an addition of a current at the AC source frequency. The fact that the signal current is not dependent on the value of the source voltage is beneficial for designs that are used over a range of voltages.

The advantage of the series resonant circuit vis-à-vis the coupled inductor circuit is that it is much cheaper. The disadvantage is the limited opportunities for modulation—it functions best at a single frequency whereas the coupled inductor circuit can be modulated easily. Both share the same concept: alternate between energy-accumulation and energy-sourcing to generate a current signal.

Figure 12A:
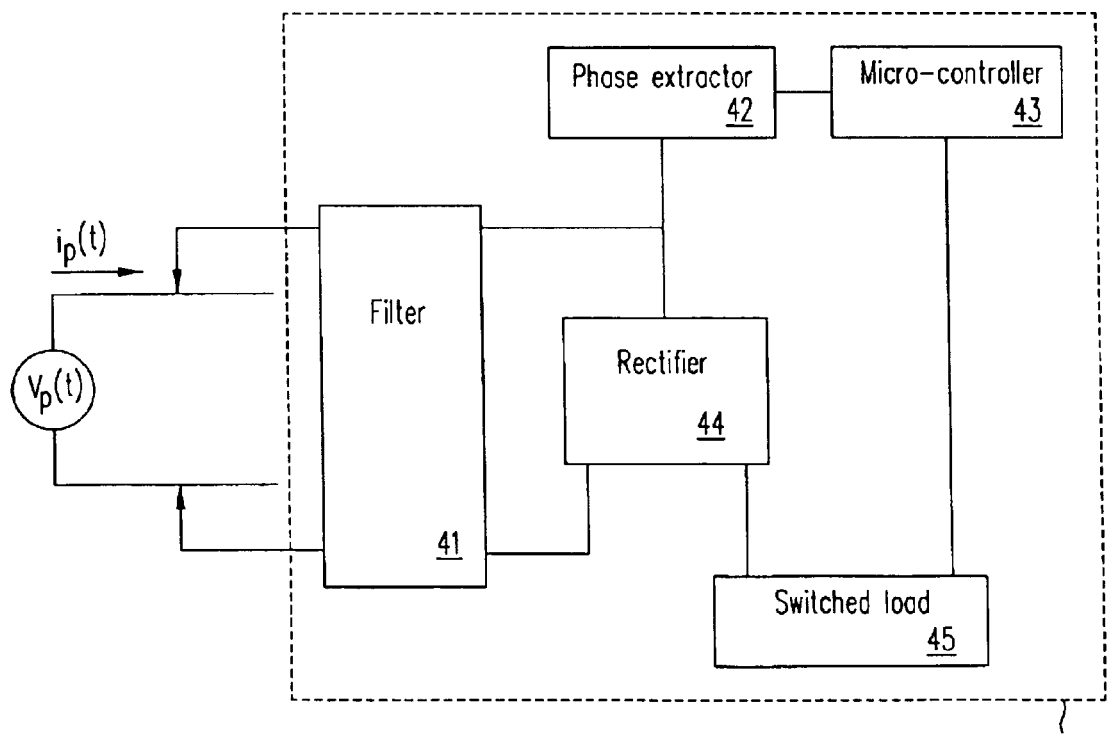
FIGS. 12A through 12C are block and schematic diagrams of a transmitter in accordance with some embodiment of the present invention.
Figure 12B:
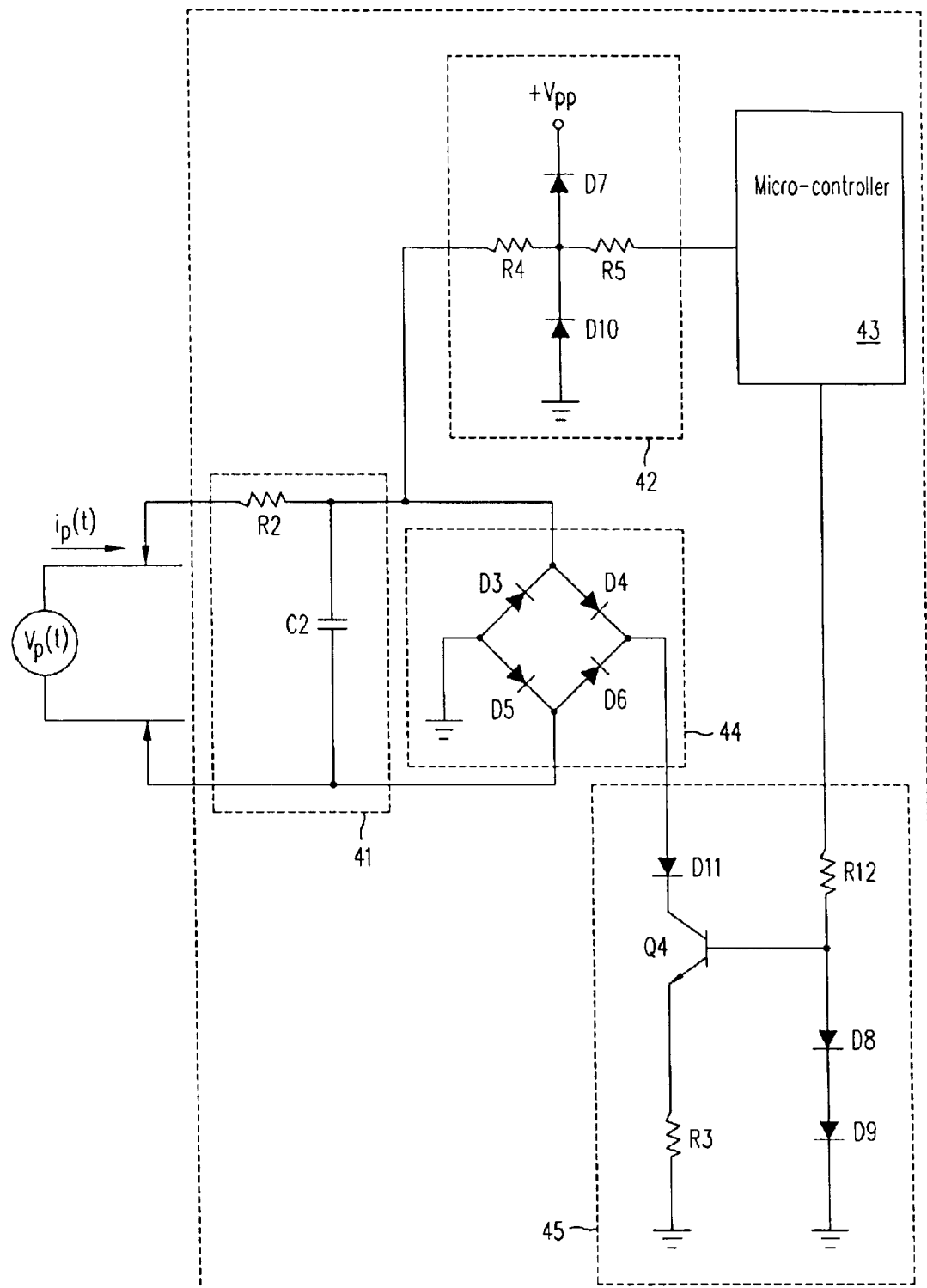
Figure 12C:
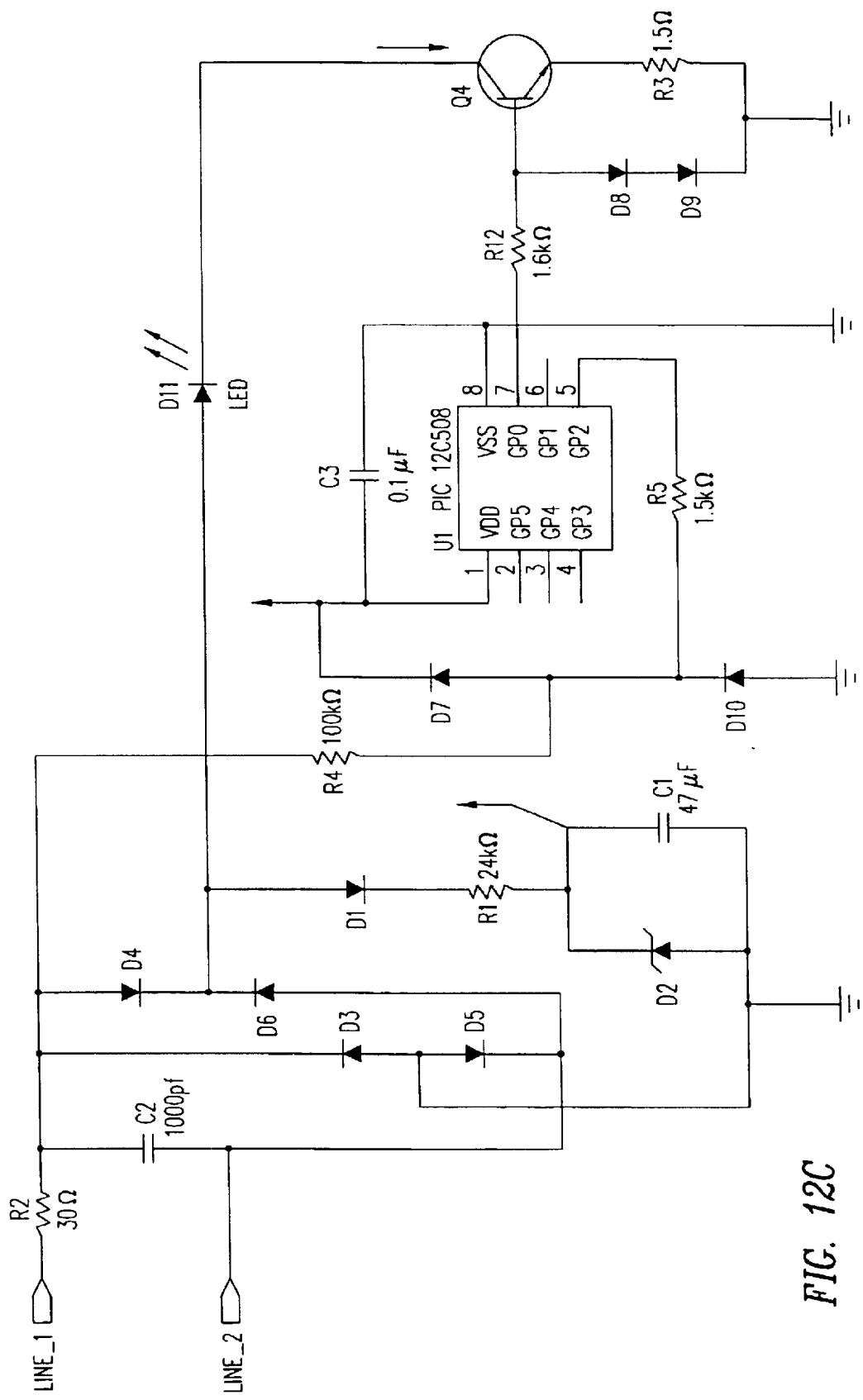

FIGS. 12A, 12B and 12C are block and schematic diagrams of a transmitter. The transmitter 10 of FIG. 12A includes a front-end filter 41, a phase extractor 42, a microcontroller 43, a rectifier 44 and a switched load 45. The front-end filter 41 filters high bandwidth noise. The phase extractor 42 tracks the frequency and phase of the incoming AC voltage $v_p(t)$. The extracted frequency and phase information is passed to the microcontroller 43. The microcontroller 32 provides a signal to the switched load 45 to control the switching of the load's switch. If phase-switching is implemented, the microcontroller 43 can use the power frequency and phase information to switch the phase of the switch control signal sent to the switched load 45. The rectifier 44 provides a bi-polar current source that is switched ON and OFF by the microcontroller 43.

FIGS. 12A, 12B and 12C are block and schematic diagrams of a transmitter in accordance with some embodiments of the present invention. The transmitter 10 of FIG. 12A includes a front-end filter 41, a phase extractor 42, a microcontroller 43, a rectifier 44 and a switched load 45. The front-end filter 41 filters high bandwidth noise. The phase extractor 42 tracks the frequency and phase of the incoming AC voltage $v_p(t)$. The extracted frequency and phase information is passed to the microcontroller 43. The microcontroller 43 provides a signal to the switched load 45 to control the switching of the load's switch. If phase-switching is implemented, the microcontroller 43 can use the power frequency and phase information to switch the phase of the switch control signal sent to the switched load 45. The rectifier 44 provides a bi-polar current source that is switched ON and OFF by the microcontroller 43.

FIG. 12C is a further detailed version of FIG. 12B, and shows a voltage generator and a PIC processor. A shunt-voltage generator, comprised of diodes D1 and D2, resistor R1 and capacitor C1, may be used as a reference for the clip-clamp circuit 42 and can be used to power the microcontroller 43. Also shown is a PIC12C508 microcontroller 43. The PIC12C508 processor is an 8-pin, 8-bit CMOS microcontroller manufactured by Microchip Technology Inc. (2355 W. Chandler Blvd., Chandler, Ariz. 85224). The processor synthesizes the carrier frequency switching signal, for example, at 930 Hz.

Figure 13A:
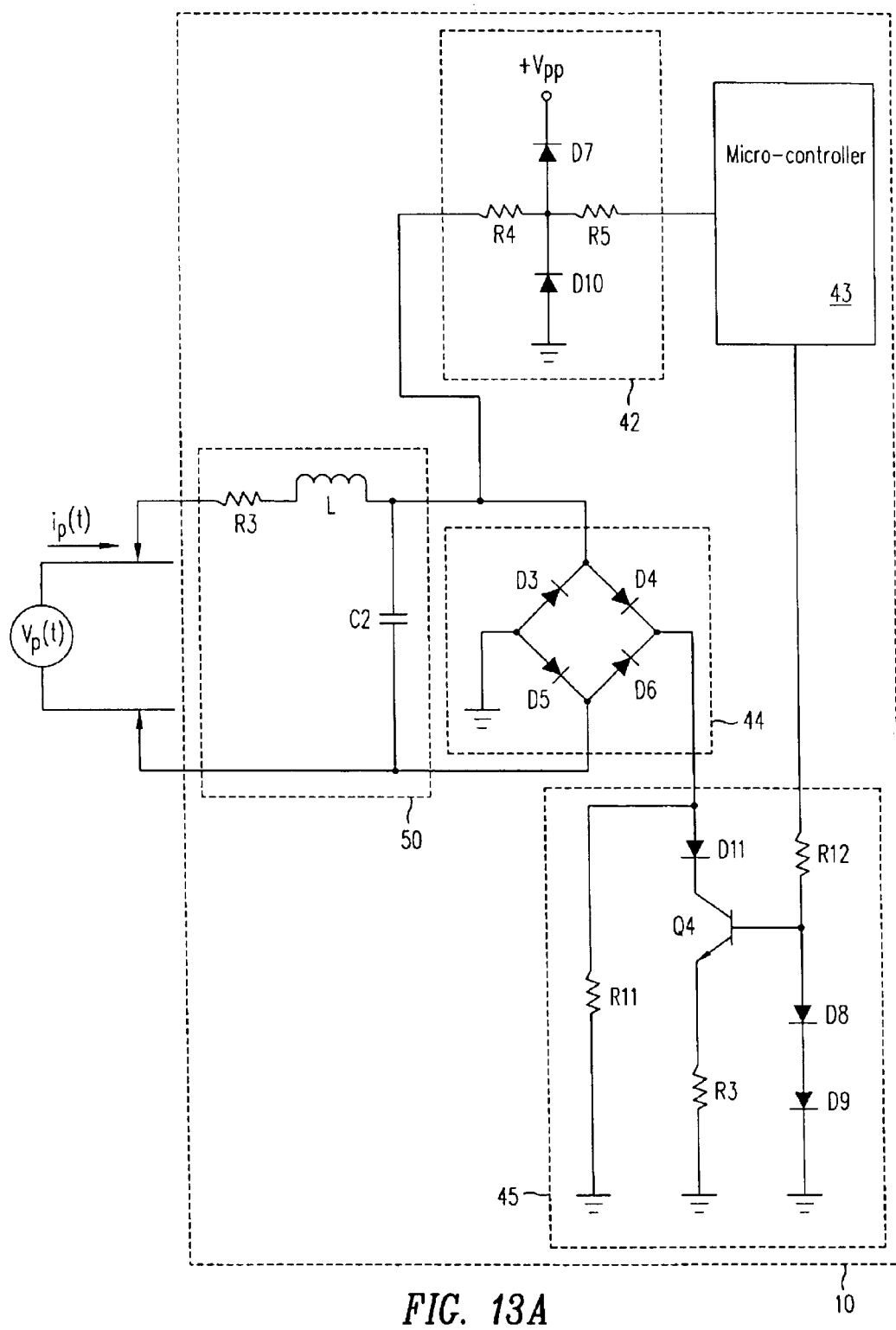
FIGS. 13A and 13B are schematic diagrams of a resonant-circuit transmitter in accordance with some embodiments of the present invention.
Figure 13B:
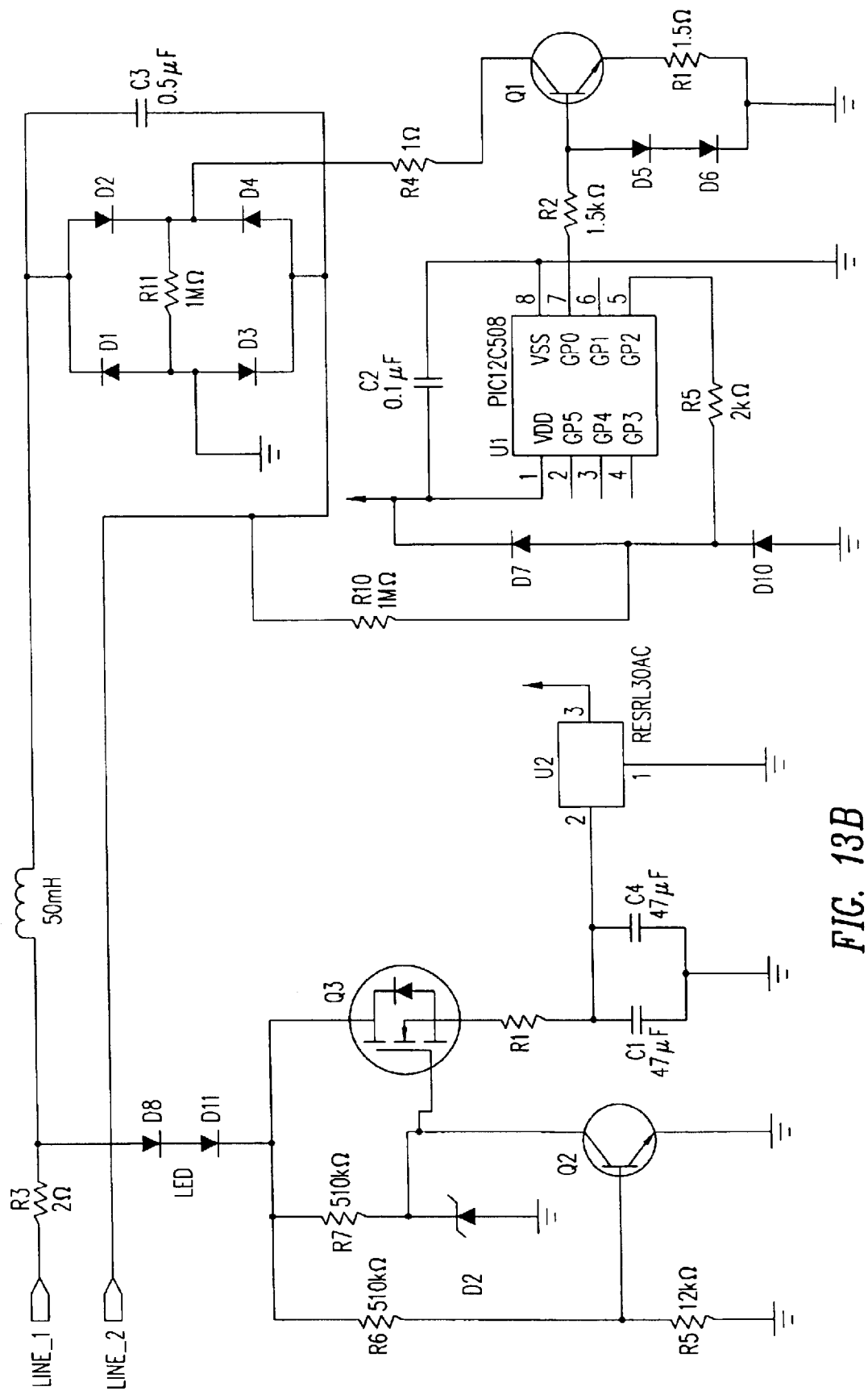
Figure 14A:
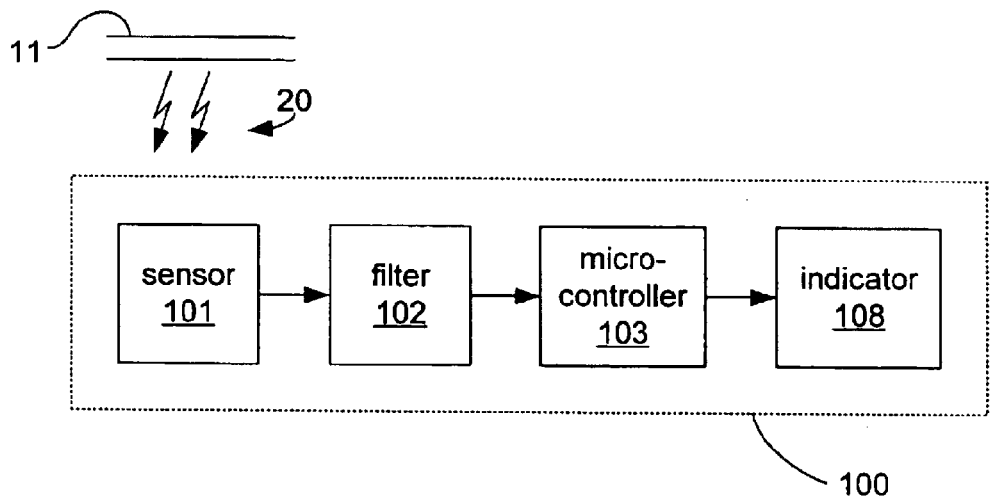
FIGS. 14A through 14D are block and schematic diagrams of receivers in accordance with some embodiments of the present invention.
Figure 14B:
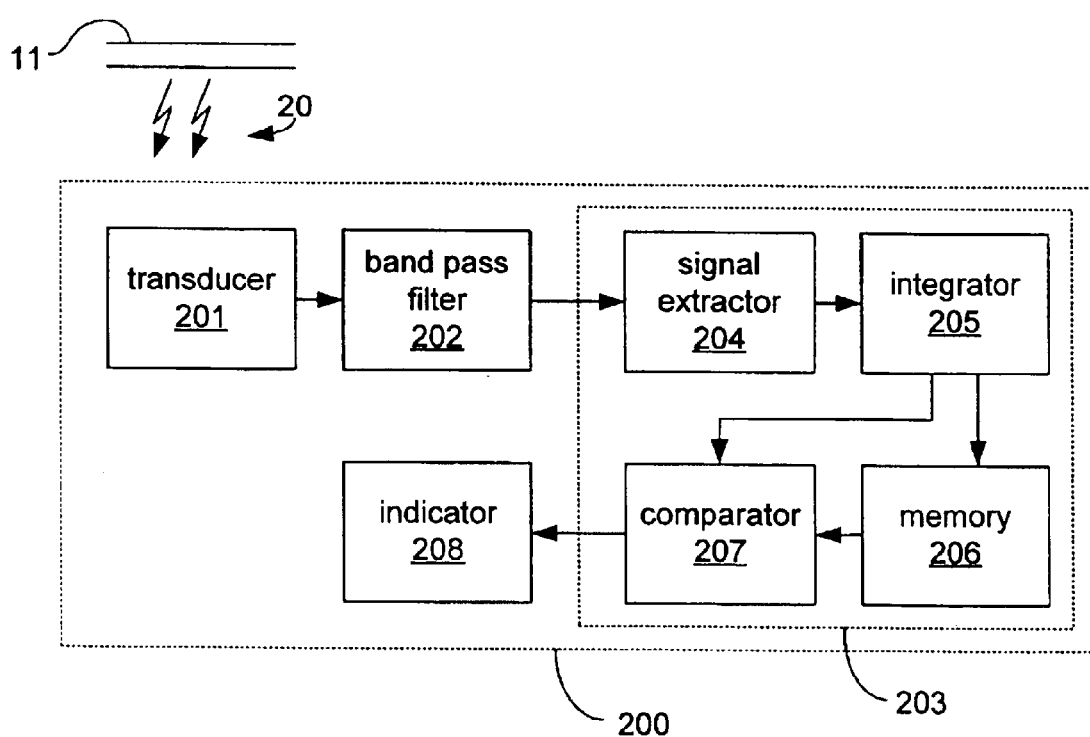
Figure 14C:
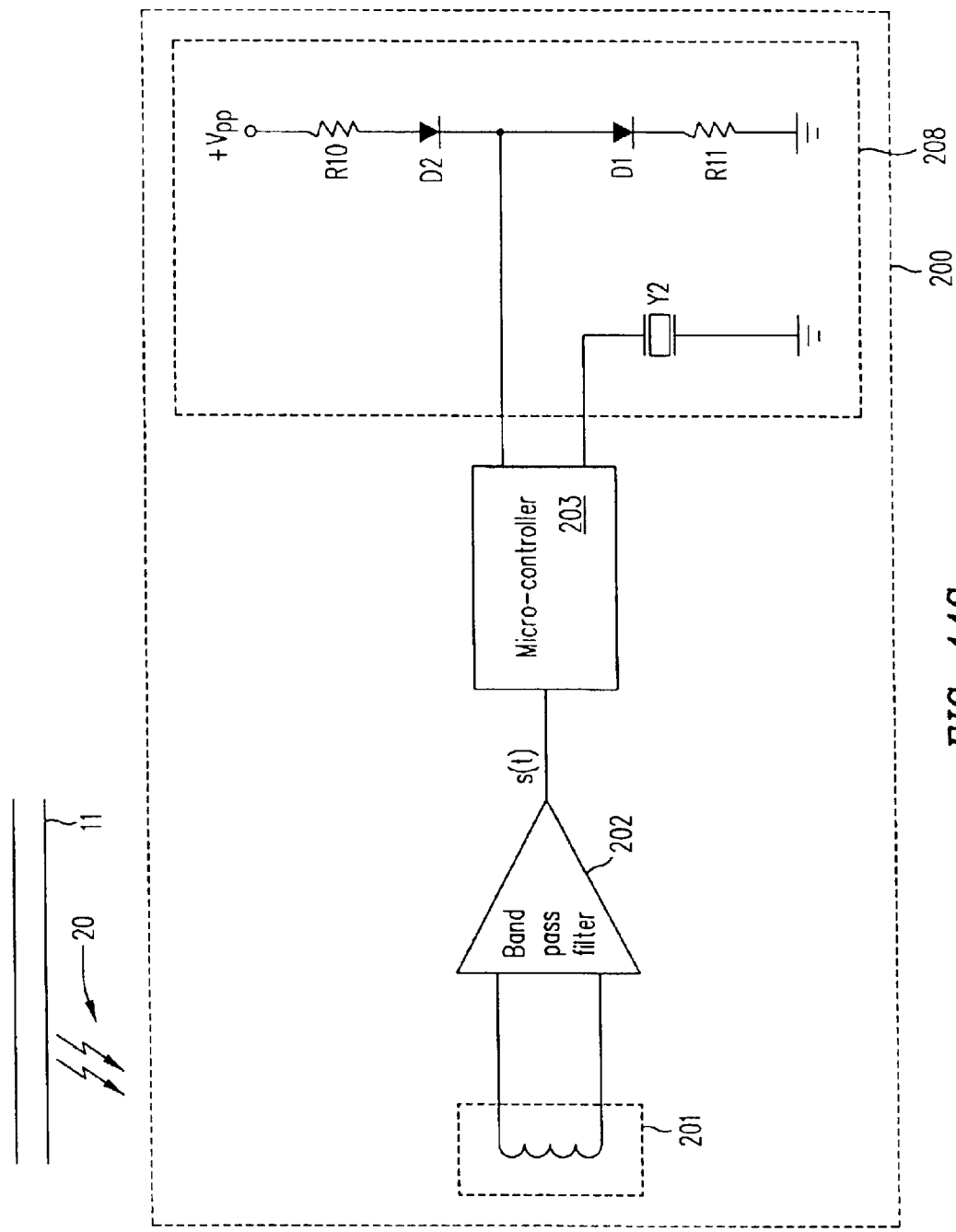
Figure 14D:
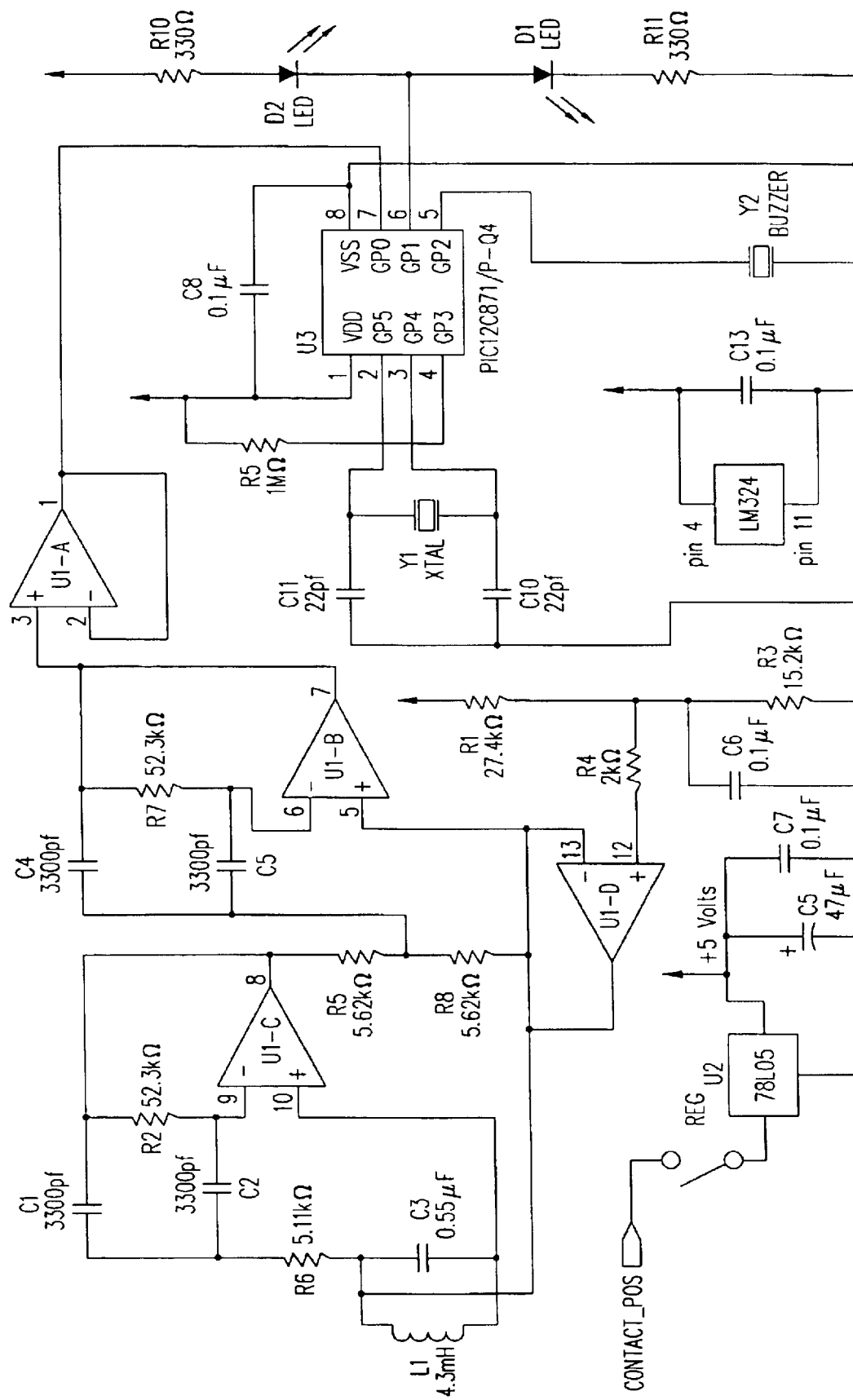

FIGS. 13A and 13B are schematic diagrams of a resonant-circuit transmitter in accordance with some embodiments, of the present invention. The low pass filter 41 of FIG. 12B has been replaced with a series RLC circuit 50. The RCL circuit is designed to resonant at the resonant frequency $f_c$. The switched current source 45 injects current through the rectifier 44 into the RCL resonant circuit 50 to compensate for energy dissipated from the circuit. A resistor R11 may be used to keep a constant current flowing through the circuit while the transistor Q4 is OFF.

In some embodiments, the microcontroller 43 synthesizes a 930 Hz carrier switching signal from $v_p(t)$. The emitter-follower is switched at a rate of 930 Hz with an on-time about 3% of the period.

FIGS. 13A, 13B transmitter operates over a wide range of voltages. The lowest operating voltage is defined by both the diode drops and by the low end of the emitter-follower amplifier's operating range. The high operating voltage is defined by the maximum voltage rating of the components. The components in FIG. 13B are designed for an AC voltage range of 100 to 277 $V_{rms}$ at 50 or 60 Hz.

The transmitters described above induce a current $i_p(t)$ on the circuit 11. A receiver 100 is required to sense the electromagnetic radiation resulting from the induced current $i_p(t)$. The receiver typically needs no physical contact with the circuit 11. The signal is measured by sensing the electromagnetic field 20 in circuit 11 with an unshielded inductor, hall-effect device, or flux gate. Passive- and/or active-analog signal-conditioning circuits with a band-pass transfer function centered at the signal carrier frequency $f_c$ precede a signal isolator that produces a metric indicative of signal intensity.

In some embodiments, a two-step process generates the signal intensity metric. First, a raw metric is derived through for example very-narrow band-pass filtering, or asynchronous demodulating of the input. Second, the raw metric is refined through integration for a period of time equal to an integral number of line frequency cycles to yield zero responses of line frequency harmonics. The integrator may be implemented, for example, with an analog gated-integrator or with digital arithmetic. Previous approaches to isolate the desired carrier frequency used simple linear time-invariant filtering rather than the time-variant technique disclosed here. These previous approaches do not provide the high degree of immunity to interference as the present invention.

Additionally, a receiver 100 may include automatic calibration. In some embodiments, automatic calibration is performed by using a combination of memory and comparators. The memory holds the value of the largest measurement seen as the electrician initially scans the candidates. Subsequently, the indicator(s) will show a positive result at the target. The comparator discriminates against the maximum and sub-maximum readings. The memory may be implemented, for example, digitally with conventional on-board or separate memory, or via analog circuitry such as a sample-and-hold circuit. Similarly, the comparator may be implemented with an analog comparator or with a digital arithmetic processor.

FIGS. 14A through 14D are block and schematic diagrams of receivers in accordance with some embodiments of the present invention. A fluctuating magnetic field generated by the signal current produces a potential across the sensor 101 or transducer 201. The potential is conditioned then band-pass filtered with filter 102 or band pass filter 202. A microcontroller 103, for example a PIC12C671, includes an ADC, which converts filtered result s(t) into a digital word. The magnitude of the magnetic field intensity s(t) at carrier frequency $f_c$ may be used as the raw metric. For example, at a carrier frequency $f_c$=930 Hz, the raw metric may be computed as:

$$\text{raw\_metric} = |s(t)| = \sqrt{(s(t)\sin(2\pi(930)t))^2 + (s(t)\cos(2\pi(930)t))^2}$$

The raw metric may be integrated for a set period of time, for example, 0.1 seconds, thus produce a refined metric that is zero at all frequencies that are multiples of 10 Hz except 930 Hz. Averaging the results from two integration operations then forms a final measurement 5 times a second.

Each time a new measurement is performed it is compared to a reference. If the measurement is less than a set percentage of the reference, then, if used, a red LED or other proper optical indicator illuminates. If the measurement is greater than the set percentage of the reference, a green LED or other proper optical indicator illuminates and/or a buzzer or other audio indicator sounds. The set percentage may be for example between approximately 70 to 95%, such as 90%. Additionally, if the measurement is greater than the reference, then the reference is set to one-half of the sum of the current reference and the last measurement. Alternatively, if the measurement is greater than the reference for two consecutive measurements, then the reference is set to one-half of the sum of the current reference and the last measurement. The process repeats, thus updating the reference value and providing visual/audio indications on an ongoing basis as appropriate. The process described implements automatic calibration in the receiver.

A method for finding an electrical circuit using a transmitter and receiver as described above includes connecting the transmitter to an electrical circuit, inducing a modulated signal at a carrier frequency onto the electrical circuit, sensing the electrical circuit with a receiver which detects the carrier frequency, by generating a metric, saving the metric as a reference, generating a next metric, comparing the reference to the next metric, and if the next metric is a set percentage of the reference, generating an alert indication to an operator, comparing the reference to the next metric; and if the next metric is greater than the reference, setting the reference to the average of the next metric and the reference; and repeating the acts of generating the next metric, comparing and generating the alert, and comparing and setting the reference.

Another method for finding an electrical circuit using a transmitter and receiver as described above includes providing a carrier frequency between approximately 120 Hz and approximately 3900 Hz, modulating the carrier frequency, generating a signal across a modulator and a load, coupling the signal to the electrical circuit; and detecting the signal in the conductive circuit.

For identifying circuit elements such as junctions, breakers, and fuses in powered AC distribution systems all of the techniques apply and the transmitter uses the available power to generate the signal by loading the line. The same methods may be used on a powered DC system (DC power systems are often used in places such as aircraft, ships, locomotives and associated rolling freight, road vehicles and spacecraft) but then only numbers 1 and 4 above confer any benefit.

For tracing a circuit in a powered AC system the automatic calibration is deleted from the receiver or simply disabled in a receiver that can perform both identification and tracing. Then the signal level is measured against an unchanging reference (supplied by a factory setting, manual calibration, or automatic calibration). Tracing is performed via a "closer/further" indication to the electrician by visual and/or audio means. In this application all of the techniques listed are applicable except number 4. When tracing powered DC systems the same modifications apply and all of the techniques may be used but only number 1 confers any benefit.

Both identification and tracing as described in the previous two paragraphs can be extended to un-powered systems through the simple expedient of providing the transmitter with an appropriate power source in series with the signal generator of FIG. 2 and shorting the main service (see FIG. 1) of the distribution system in question.

The above detailed descriptions are provided to illustrate specific embodiments of the present invention and are not intended to be limiting. Numerous modifications and variations within the scope of the present invention are possible. The present invention is defined by the appended claims.

We claim:
1. An electrical circuit finder comprising:
a transmitter for transmitting an electrical signal to a conductive circuit and which includes:
a generator having an output for providing a carrier frequency between approximately 120 Hz and approximately 3900 Hz wherein the carrier frequency is between an adjacent pair of harmonics of an AC power system; and
a modulator having a control input coupled to the output of the generator and an output for coupling to the conductive circuit; and
a receiver which detects the transmitted electrical signal in the conductive circuit wherein the receiver includes a filter having zeros at the adjacent pair of harmonics.

2. The electrical circuit finder of claim 1, wherein the adjacent pair of harmonics is a pair of harmonics of 50, 60 or 400 Hz.

3. The electrical circuit finder of claim 1, wherein the carrier frequency is between approximately 240 Hz and approximately 2000 Hz.

4. The electrical circuit finder of claim 1, wherein the carrier frequency is approximately 930 Hz.

5. The electrical circuit finder of claim 1, wherein the modulator includes a non-linear circuit.

6. The electrical circuit finder of claim 5, wherein the non-linear circuit is a single switch.

7. The electrical circuit finder of claim 5, wherein the non-linear circuit includes a plurality of switches.

8. The electrical circuit finder of claim 1, wherein the modulator includes a linear circuit.

9. The electrical circuit finder of claim 8, wherein the linear circuit is an amplifier.

10. The electrical circuit finder of claim 1, wherein the modulator includes an emitter-follower circuit.

11. The electrical circuit finder of claim 1, wherein the carrier frequency is modulated by a sign function.

12. The electrical circuit finder of claim 11, wherein the adjacent pair of harmonics is a pair of harmonics of 50, 60 or 400 Hz.

13. The electrical circuit finder of claim 1, wherein the transmitter further includes a load coupled to the modulator and wherein the load is reactive.

14. The electrical circuit finder of claim 1, wherein the transmitter further includes a load coupled to the modulator and wherein the load includes a first inductor and a second inductor, the first and second inductors are magnetically coupled, and the first inductor is serially connected to the modulator.

15. The electrical circuit finder of claim 14, further comprising a second modulator serially connected to the second inductor.

16. The electrical circuit finder of claim 1, wherein the transmitter further includes a load coupled to the modulator and wherein the load includes a resonant circuit.

17. The electrical circuit finder of claim 16, wherein the resonant circuit includes a capacitor and wherein the modulator includes a switched-current source connected in parallel to the capacitor in the resonant circuit.

18. The electrical circuit finder of claim 1, wherein:
the electrical circuit finder is adapted to find a conductive circuit which is part of the AC power system; and
the carrier frequency is between an adjacent pair of harmonics of the AC power system; and
the carrier frequency is modulated by a sign function which represents a polarity of a voltage signal of the AC power system.

19. The electrical circuit finder of claim 1, wherein the filter of the receiver includes a time-variant filter.

20. The electrical circuit finder of claim 19, wherein the time-variant filter integrates for an integral number of cycles of a 50, 60 or 400 Hz power system.

21. The electrical circuit finder of claim 19, wherein the time-variant filter is an analog switched-integrator.

22. The electrical circuit finder of claim 19, wherein the time-variant filter is a digital filter.

23. A method for finding an electrical circuit, comprising the acts of:

provide a carrier frequency between approximately 120 Hz and approximately 3900 Hz wherein the carrier frequency is between aN adjacent pair of harmonics of an AC power system;

modulating the carrier frequency;

generating a signal across a load using the carrier frequency;

coupling the generated signal to the electrical circuit; and detecting the signal in the electrical circuit with a receiver including a filter having zeros at the adjacent pair of harmonics of the AC power system.

24. The method of claim 23, wherein the carrier frequency comprises a phased-switched signal.

25. The method of claim 23, wherein the act of detecting the signal in the electrical circuit comprises sensing the carrier frequency, wherein the sensing includes the acts of:

generating a metric;

saving the metric as a reference;

generating a next metric;

comparing the reference to the next metric; and if the next metric is a set proportion of the reference, generating an alert;

comparing the reference to the next metric; and if the next metric is greater than the reference, setting the reference to the average of the next metric and the reference; and repeating the acts of generating the next metric, comparing and generating the alert, and comparing and setting the reference.

26. The method of claim 25, wherein the set proportion is approximately between 70 to 95 percent.

27. The method of claim 26, wherein the alert includes providing an optical indication.

28. The method of claim 26, wherein the alert includes providing an audio indication.

29. An electrical circuit finder comprising:

a transmitter including a capacitor adapted to be coupled across the electrical circuit;

a controller generating a control signal having a fundamental frequency between 120 Hz and 3900 Hz; and a switched load coupled in parallel to the capacitor, the switched load including a current source modulated by the control signal and a transmitter adapted to receive a signal generated by the transmitter wherein the receiver includes a filter having zeros at the adjacent pair of harmonics.

30. The electrical circuit finder of claim 29, further comprising an inductor coupled in series with the capacitor and coupled in series with the switched load.

* * * * *

UNITED STATES PATENT AND TRADEMARK OFFICE
CERTIFICATE OF CORRECTION

| | |
|---|---|
| PATENT NO. | : 6,933,712 B2 |
| APPLICATION NO. | : 10/197617 |
| DATED | : August 23, 2005 |
| INVENTOR(S) | : Larry Miller et al. |

It is certified that error appears in the above-identified patent and that said Letters Patent is hereby corrected as shown below:

In Claim 23, column 17, line 14, please replace "frequency is between aN adjacent pair of harmonics of" with -- frequency is between an adjacent pair of harmonics of --.

In Claim 29, column 18, line 26, please replace "the control signal and a transmitter adapted to receive" with -- the control signal and a receiver adapted to receive --.

Signed and Sealed this

Twentieth Day of July, 2010

David J. Kappos
*Director of the United States Patent and Trademark Office*